United States Patent [19]

Berlekamp et al.

[11] Patent Number: 4,958,348
[45] Date of Patent: Sep. 18, 1990

[54] HYPERSYSTOLIC REED-SOLOMON DECODER

[75] Inventors: Elwyn R. Berlekamp, Berkeley; Gadiel Seroussi, Cupertino; Po Tong, Alameda, all of Calif.

[73] Assignee: Eastman Kodak Company, Rochester, N.Y.

[21] Appl. No.: 274,120

[22] Filed: Nov. 21, 1988

Related U.S. Application Data

[63] Continuation-in-part of Ser. No. 155,244, Feb. 12, 1988, abandoned.

[51] Int. Cl.$^5$ .............................................. G06F 11/10
[52] U.S. Cl. ...................................... 371/37.1; 371/42
[58] Field of Search ................................. 371/37.1, 42

[56] References Cited

U.S. PATENT DOCUMENTS 4,665,523  5/1987  Citron et al. ...................... 371/37.1

OTHER PUBLICATIONS

Kung, S. et al., "Wavefront Array Processor . . . ", IEEE Trans on Computers, vol. C-31, No. 11(Nov. 1982), pp. 1054–1065.

"A Method for SSolving Key Equation for Decoding Goppa Codes" by Yasuo Sugiyama, Masao Kasahara, Shigeichi Hiraswa, and Toshihiko Hamekawa, Information and Control 27, 87–89 (1975), pp. 87–99.

"Systolic Stacks, Queues, and Counters" by Leo J. Guibas and Frank M. Liang, 1982 Conference on Advanced Research In VSLI, M.I.T., Jan. 27, 1982 pp. 155–164.

"Design of the PSC:", A Programmable Systolic Chip: by Allan L. Fisher, H. T. Kung, Louis M. Monier, Hank Walker, and Yasunori Dohi, Proc. Third Caltech Conference on VLSI, Computer Sciences Press, 1983, pp. 287–302.

"Systolic VLSI Arrays for Polynomial GCD Computation", by Richard P. Brent and H. T. Kung, IEEE Transactions On Computers, vol. C-33, No. 8, Aug. 1984., pp. 731–736.

Primary Examiner—Jerry Smith
Assistant Examiner—Stephen M. Baker
Attorney, Agent, or Firm—Stephen C. Kaufman

[57] ABSTRACT

A Reed-Solomon decoder is implemented in systolic arrays wherein clock and control information propagate serially with the data. Progressive loss of coherence in such arrays is compensated by a folded array structure symmetrized in clock control whereby coherence is progressively re-established at the output of each such array.

4 Claims, 12 Drawing Sheets

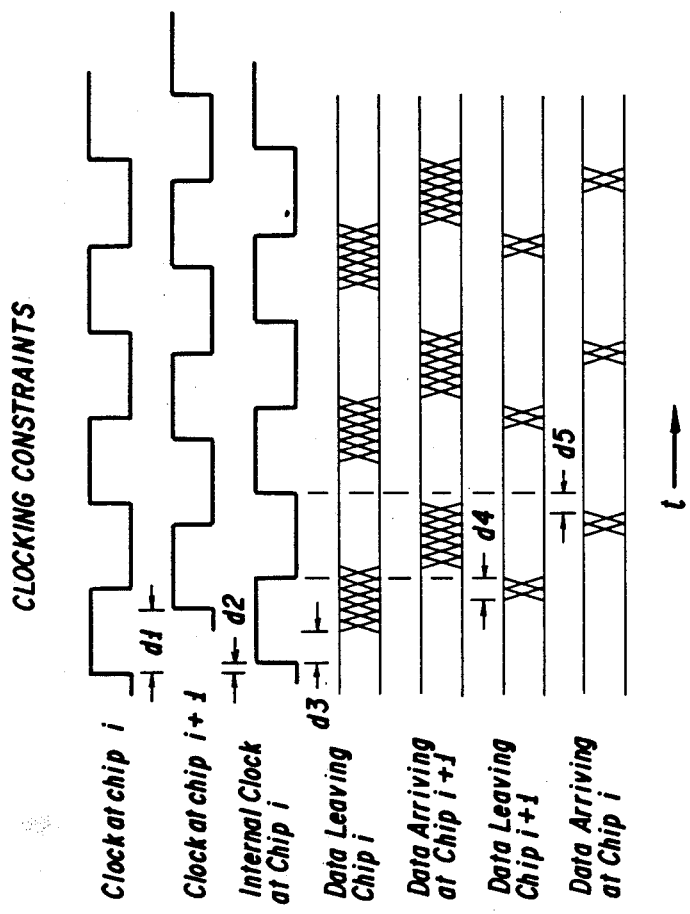

10a

| LOG | ELEMENT |
|---|---|
| 0 | 01 |
| 1 | 08 |
| 2 | 0d |
| 3 | 25 |
| 4 | 0a |
| 5 | 1d |
| 6 | 34 |
| 7 | 13 |
| 8 | 09 |
| 9 | 05 |
| 10 | 28 |
| 11 | 2f |
| 12 | 17 |
| 13 | 29 |
| 14 | 27 |
| 15 | 1a |
| 16 | 0c |
| 17 | 2d |
| 18 | 07 |
| 19 | 38 |
| 20 | 3e |
| 21 | 0e |
| 22 | 3d |
| 23 | 16 |
| 24 | 21 |
| 25 | 2a |
| 26 | 3f |
| 27 | 06 |
| 28 | 30 |
| 29 | 33 |
| 30 | 2b |
| 31 | 37 |
| 32 | 0b |
| 33 | 15 |
| 34 | 39 |
| 35 | 36 |
| 36 | 03 |
| 37 | 18 |
| 38 | 1c |
| 39 | 3c |
| 40 | 1e |
| 41 | 2c |
| 42 | 0f |
| 43 | 35 |
| 44 | 1b |
| 45 | 04 |
| 46 | 20 |
| 47 | 22 |
| 48 | 32 |
| 49 | 23 |
| 50 | 3a |
| 51 | 2e |
| 52 | 1f |
| 53 | 24 |
| 54 | 02 |
| 55 | 10 |
| 56 | 11 |
| 57 | 19 |
| 58 | 14 |
| 59 | 31 |
| 60 | 3b |
| 61 | 26 |
| 62 | 12 |
| 63 | 01 |

| ELEMENT | LOG |
|---|---|
| 00 | -1 |
| 01 | 0 |
| 02 | 54 |
| 03 | 36 |
| 04 | 45 |
| 05 | 9 |
| 06 | 27 |
| 07 | 18 |
| 08 | 1 |
| 09 | 8 |
| 0a | 4 |
| 0b | 32 |
| 0c | 16 |
| 0d | 2 |
| 0e | 21 |
| 0f | 42 |
| 10 | 55 |
| 11 | 56 |
| 12 | 62 |
| 13 | 7 |
| 14 | 58 |
| 15 | 33 |
| 16 | 23 |
| 17 | 12 |
| 18 | 37 |
| 19 | 57 |
| 1a | 15 |
| 1b | 44 |
| 1c | 38 |
| 1d | 5 |
| 1e | 40 |
| 1f | 52 |
| 20 | 46 |
| 21 | 24 |
| 22 | 47 |
| 23 | 49 |
| 24 | 53 |
| 25 | 3 |
| 26 | 61 |
| 27 | 14 |
| 28 | 10 |
| 29 | 13 |
| 2a | 25 |
| 2b | 30 |
| 2c | 41 |
| 2d | 17 |
| 2e | 51 |
| 2f | 11 |
| 30 | 28 |
| 31 | 59 |
| 32 | 48 |
| 33 | 29 |
| 34 | 6 |
| 35 | 43 |
| 36 | 35 |
| 37 | 31 |
| 38 | 19 |
| 39 | 34 |
| 3a | 50 |
| 3b | 60 |
| 3c | 39 |
| 3d | 22 |
| 3e | 20 |
| 3f | 26 |

Fig. 9b

HYPERSYSTOLIC REED-SOLOMON DECODER

This is a continuation-in-part of application Ser. No. 155,244, filed 2/12/88, now abandoned.

FIELD OF THE INVENTION

The present invention relates generally to error correction for digital communications and particularly describes an implementation of a Reed-Solomon type decoder apparatus in a hypersystolic architecture.

BACKGROUND OF THE INVENTION

Error correction in the Reed-Solomon environment has been implemented in conventional serial architectures which can accommodate a given input data rate in either of two ways. In one approach, the decoder runs at a rate sufficiently high in comparison with the input rate, to assure that the decoder never falls behind the input. This can represent a severe constraint upon input rates. In the other approach, data is delayed by an interval of sufficient length such that "on the average" the decoder is able to keep up with the input. Implicit in this approach is the assumption that worst case situations are sufficiently brief and sufficiently infrequent. The first approach places a limit on achievable throughput while the second approach limits tolerable worst case performance.

Exposition of Reed-Solomon codes may be found in Berlekamp, Algebraic Coding Theory, Agean Park Press (1984). An RS code is succintly described as a block sequence of Galois field symbols where each such field symbol is a field element of the Galois field $GF(2^m)$. Thus each symbol comprises m bits and the length of any such received block sequence is $n = 2^m - 1$. The maximum number of erroneous symbols which may be corrected in any such block is given by T and the encoding process creates redundancy in the form of 2T check symbols from $k = n - 2T$ message symbols. The block comprises k message symbols and r redundant symbols annexed thereto by the encoder. Thus $n = k + r$ and T is (the integer part of ) r/2. Any such block sequence of symbols may be interpreted as a polynomial C(x), the coefficients of which correspond to the each of the m-bit symbols. A block sequence as above described is a codeword if the polynomial C(x) is a multiple of the generator polynomial g(x) of the code where $$g(x) = \prod_{L+1}^{L+r} (x - \alpha^i)$$

The quantity $\alpha$ is a primitive element of the field and L is an integer which can be selected to simplify the encoding procedure.

The encoding process assures that C(x) will be a codeword, but in the transmission of the block a variety of corrupting influences may be operative to produce a received block of symbols which differs from the encoded information. Within the limits of the code, it is the function of the decoder to detect the introduced errata and to correct same.

In the decoding process for a Reed Solomon code, the following steps are usually performed sequentially:

(a) Power sum symmetric functions are computed from the received codeword.

(b) The key equation is solved to obtain the error location polynomial $\sigma(x)$ and error value polynomial (x).

(c) The polynomials $\sigma(x)$ and $\omega(x)$ are evaluated to ascertain both the locations and the values to add back to the received (erroneous) symbols at the corresponding error locations.

(d) The error value is then added to the erroneous symbol at the error location to correct the error.

All the arithmetical operations implicit in the above prescription are defined on the finite field $GF(2^m)$ as is well known to one of average skill in the art.

Operations as described above are implemented in the prior art with Von Neuman architectures, e.g. systems wherein each sequential operation is a discrete condition precedent for the succeeding operation. Consequently, the allowable complexity of a process in such an implementation bears a rather direct relationship to the time available for such process. Instruction overlap and pipelining are approaches which achieve some substantial improvement over the strict Von Neuman model, but it may be observed that the implementation of operations is not expensive in semiconductor hardware, whereas the number and density of interconnections is both an economic and physical limitation. As a result of VLSI technology, systolic arrays provide an alternative form of architecture especially attractive for application to error correction problems.

An RS decoder is known which operates at a serial channel rate of 120 Mbps, achieving a coding gain of 3.3 db at an input bit error rate of $10^{-6}$. The performance of this decoder, (Cyclotomics Model 120) is known to experience degradation when subject to continuous worst case data. The present invention represents an increase in output channel rate by a factor of as much as about 17 over the aforementioned Model 120. This is accomplished in the first instance by a highly parallel architecture and further, by an implementation in GaAs integrated circuits as below described.

In the art, a systolic architecture is characterized by clocked propagation of information through a series of rather similar stages, each of which provides some simple incremental processing step. By a hypersystolic architecture, there is meant a systolic arrangement in which control information, including clocking, propagates serially together with the data through the various elements of the system. Thus, there is no requirement that global synchrony be maintained between the several integrated devices of the system.

SUMMARY OF THE INVENTION

The present invention implements a Reed-Solomon decoder in a hypersystolic architecture. The clocking datum enters each cell of the array in parallel with the information data stream. Generally each cell communicates only with a nearest input neighbor and a nearest output neighbor. Clocking information, hold times and the like are maintained on a local basis: there is no requirement for global synchrony constraining components which are at some remove from a nearest neighbor relationship. Although global synchrony is absent, the functional behavior of the system preserves the efficiency of a globally synchronous system. Further, internal control information also propagates with the data stream and clocking to prescribe the local state of the system independent of any synchrony constraint.

A variety of code parameters are accommodated by providing serialized logic structures which permit variation of code length and redundancy over a range limited by maximum designed code parameters.

Implementation of the error correction functions of syndrome generation, computation of error locator and error valuator polynomials, and application of these to the input data stream are achieved in a serialised architecture of novel structure.

System efficiency is augmented by the employment of a quasi-division operation implemented in a pair of quite similar cascaded operations effectuated in quite similar structures. This constitutes a structural improvement over the conventional implementation of a division operation having the character of the cascade of an inversion and a multiplication at the full precision of the numerical datums, an arrangement of operations of rather dissimilar character requiring rather dissimilar implementation.

DETAILED DESCRIPTION OF THE FIGURES

FIG. 2 is a general timing diagram for adjacent cells of the array.

Figure 3A:
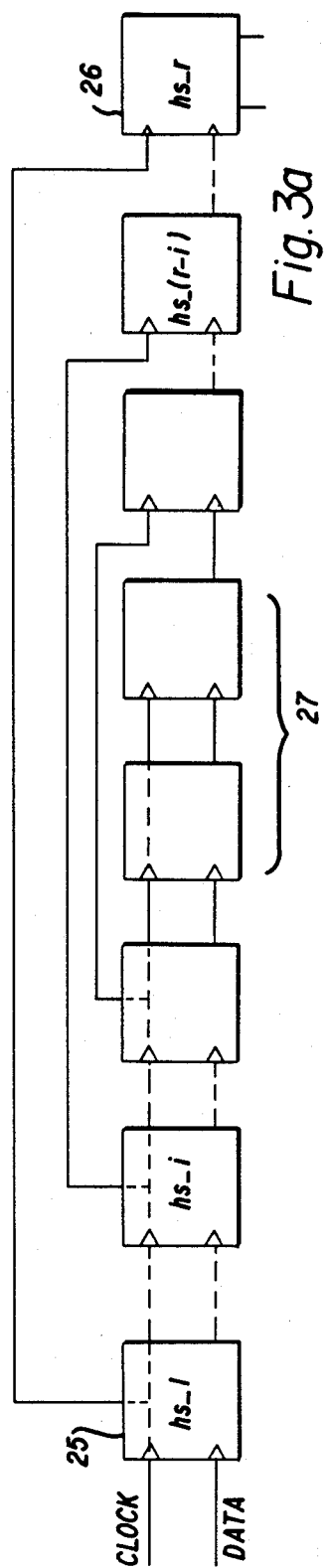
Figure 3B:
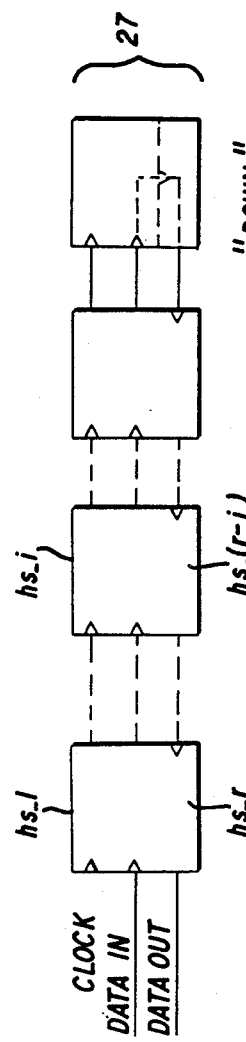

FIG. 3a and 3b describe general features of a folded hypersystolic array.

Figure 4:
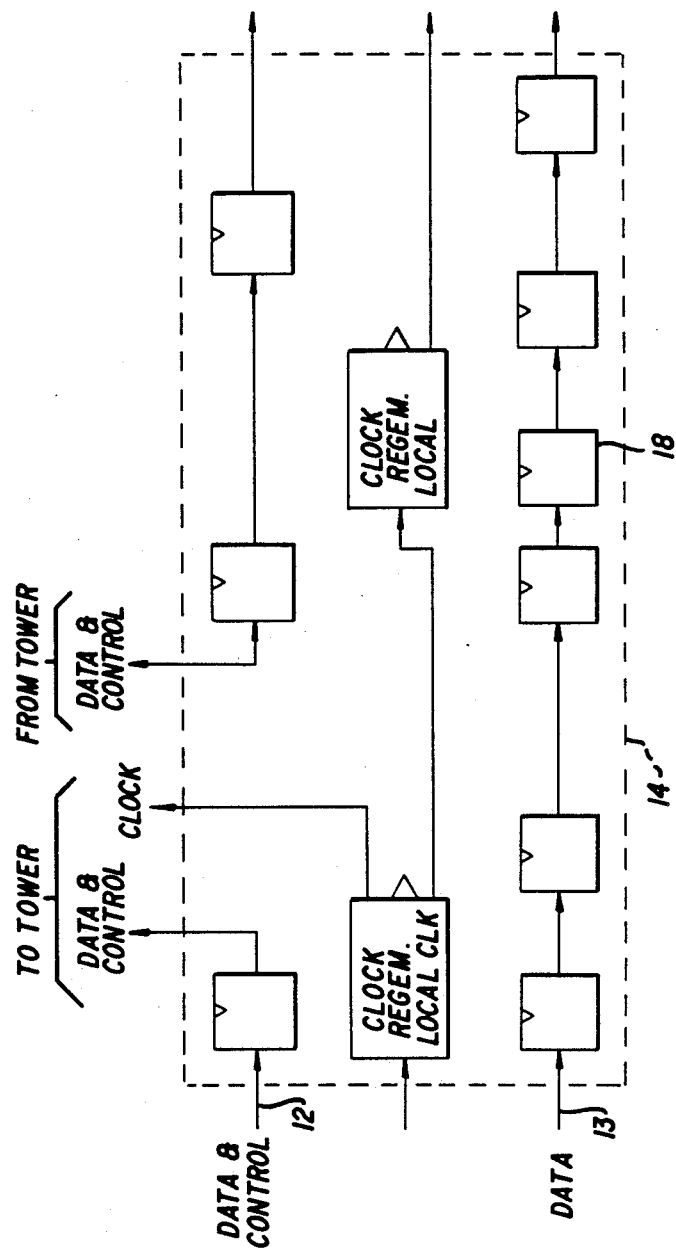

FIG. 4 describes the structure of a portion of the main street structure.

Figure 5:
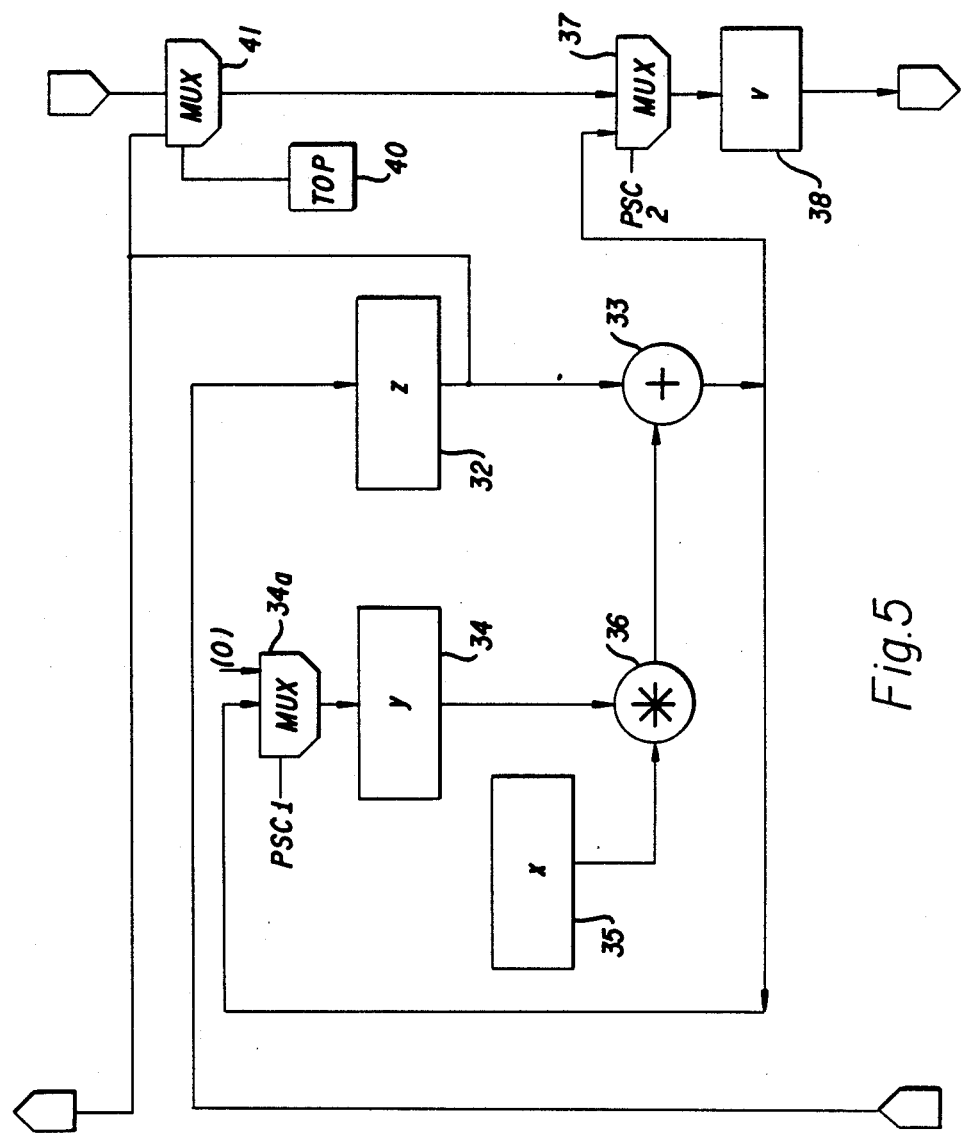

FIG. 5 is a functional description of a stage of the power sum tower.

Figure 6A:
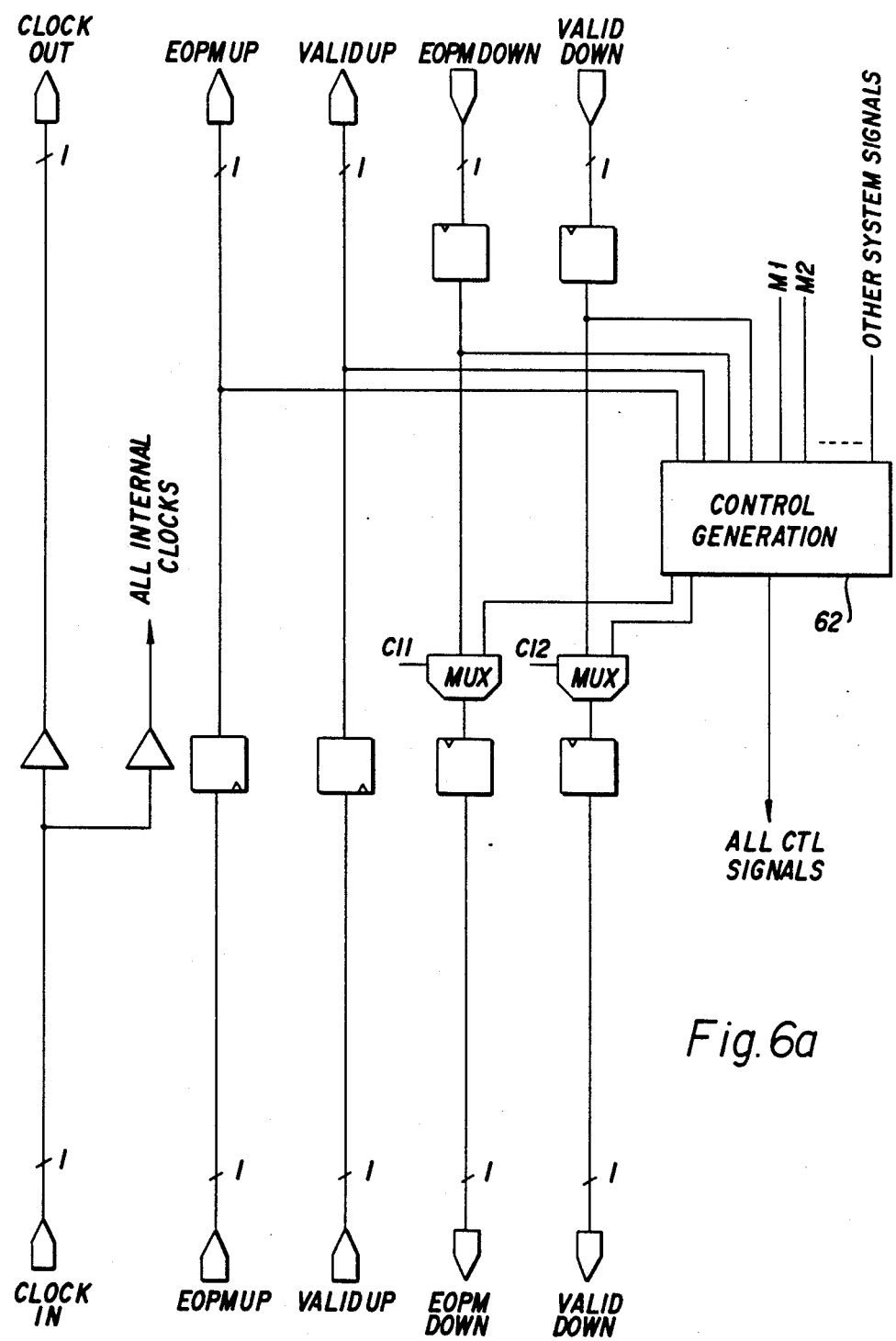
Figure 6B:
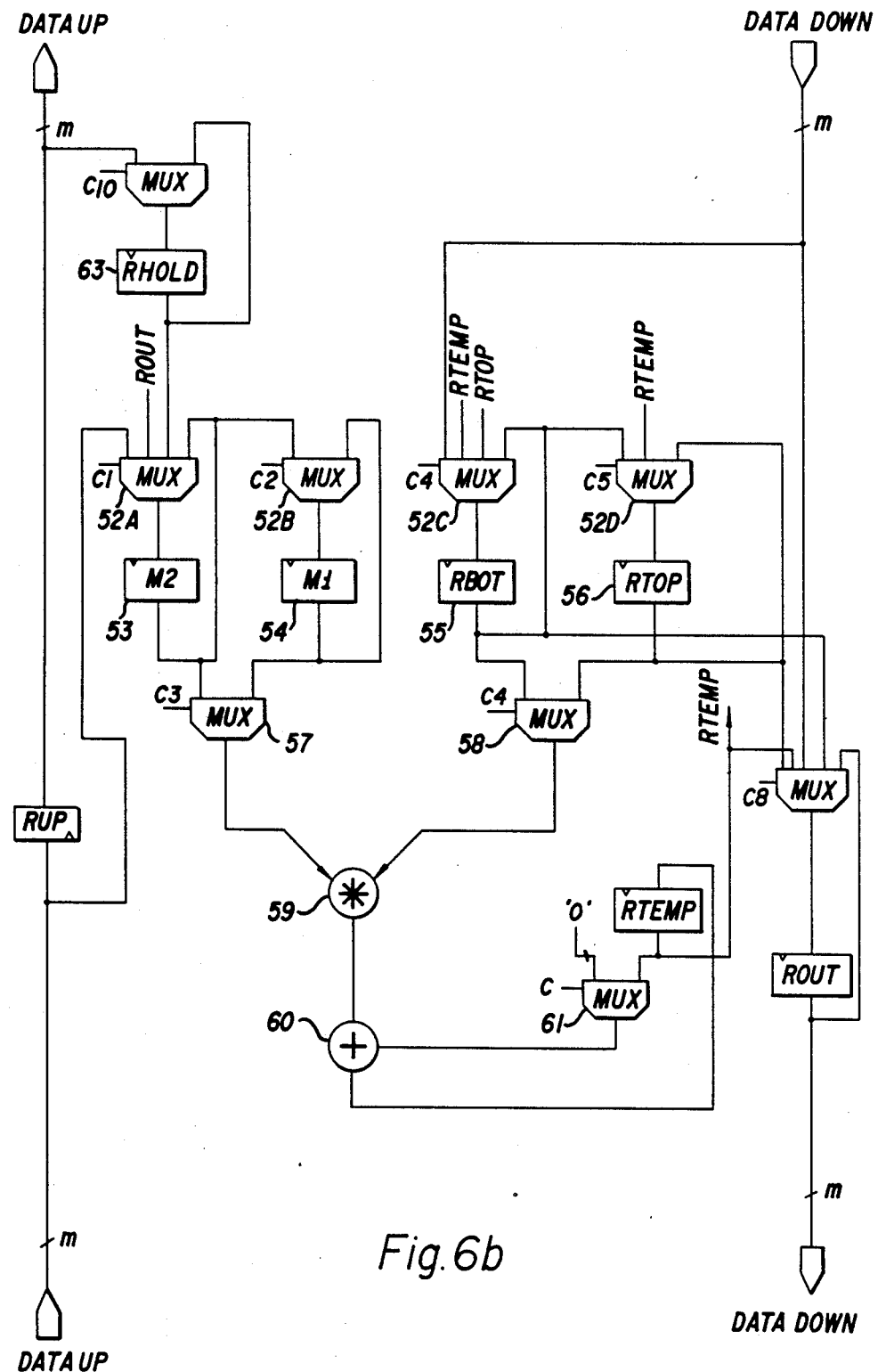

FIGS. 6a and 6b are a functional description of a cell forming a component of the Sugiy tower.

Figure 7A:
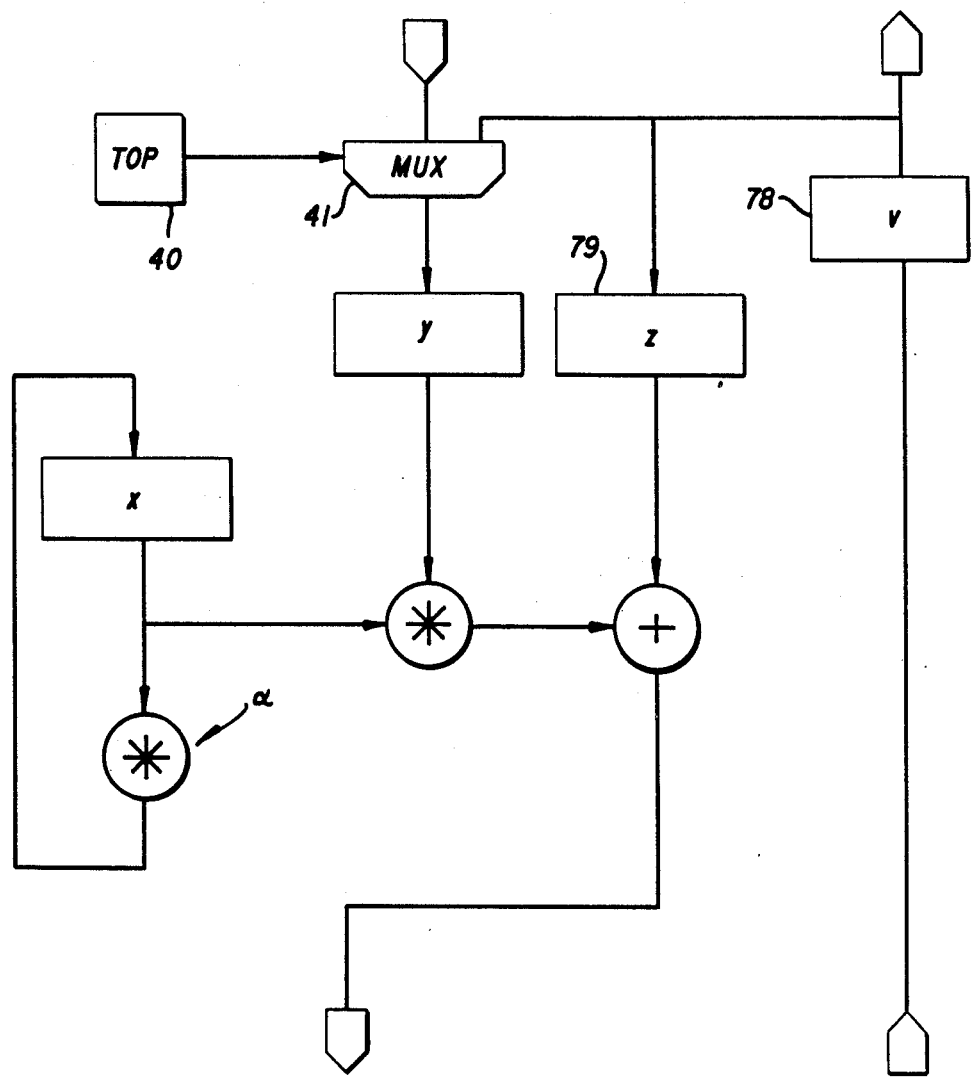

FIG. 7a is a functional description of a cell forming one branch of the correction tower.

Figure 7B:
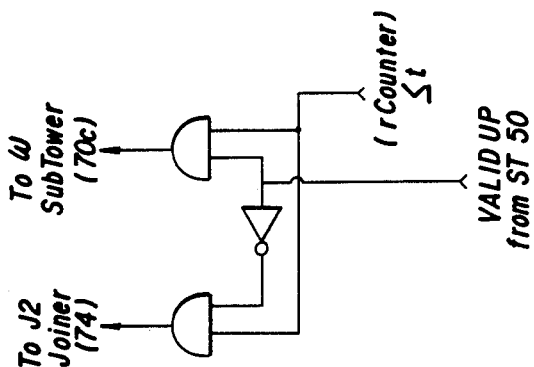

FIG. 7b indicates the logic for directing the VALID tag to accompany the respective coefficient to the correct subtower of the CT 70.

Figure 8A:
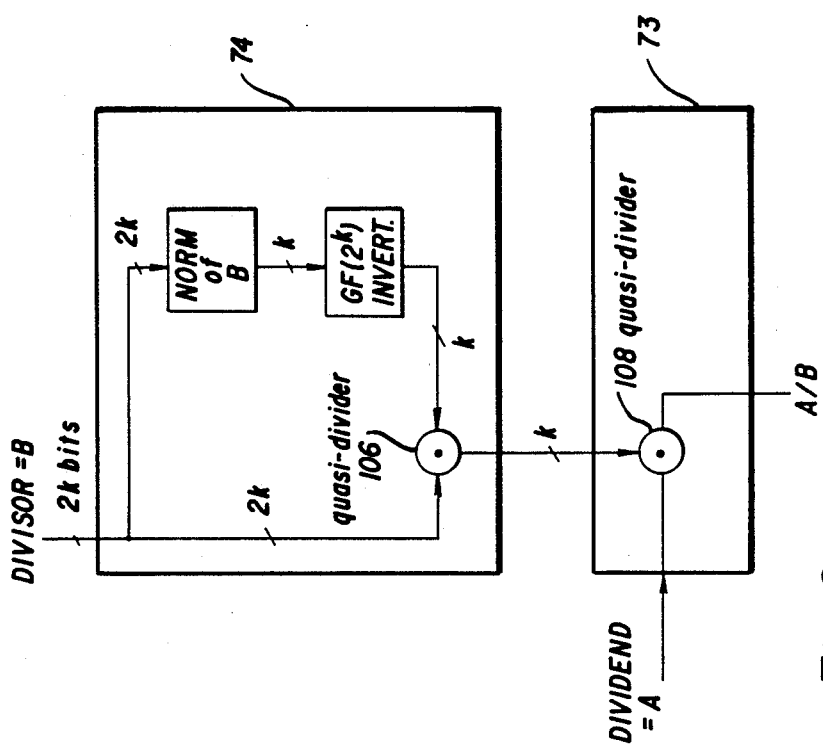

FIG. 8a describes implementation of a quasi division operation from two quasi division operations.

Figure 8B:
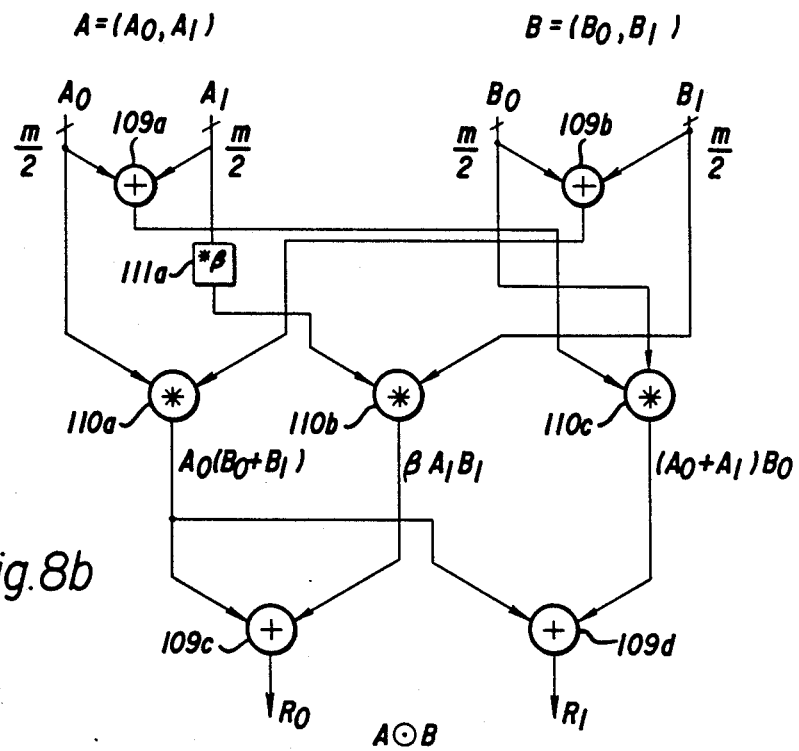
Figure 8C:
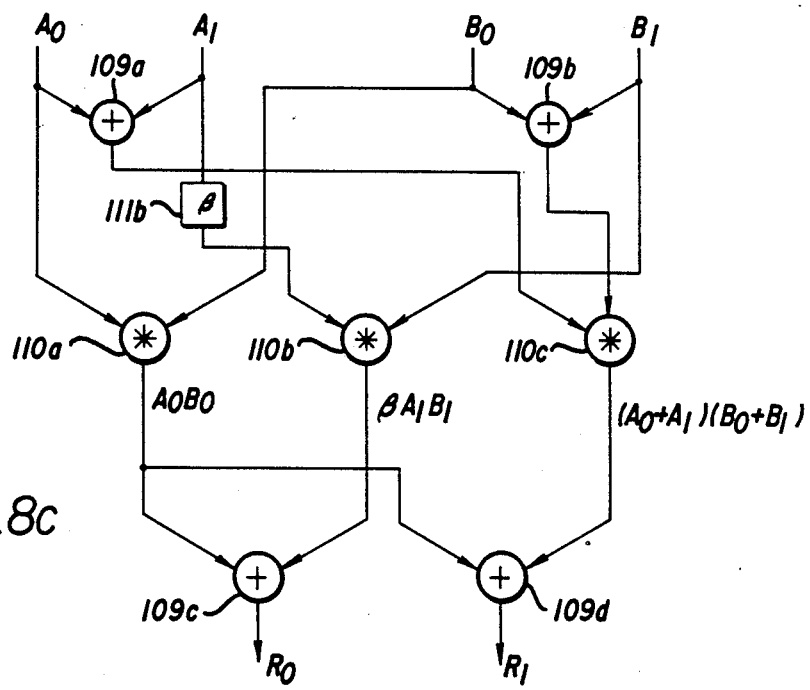

FIGS. 8b and 8c respectively compare the structure of a quasi-divider and multiplier for the case m=6.

FIGS. 9a and 9b are tables of algebraic elements and logarithms thereof for GF $\{2^6\}$.

Figure 10A:
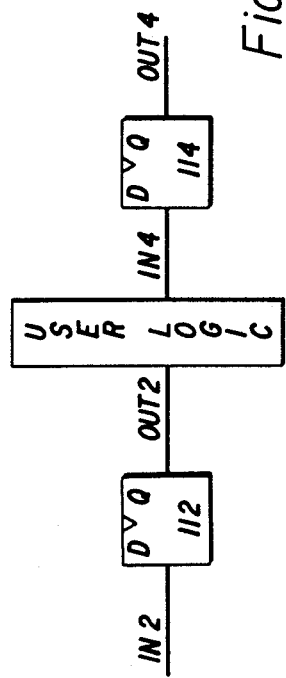
Figure 10B:
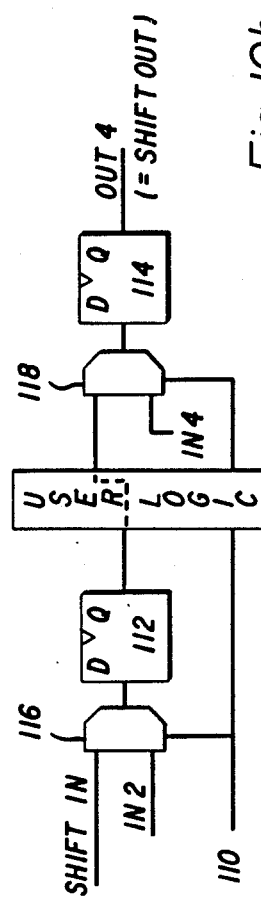

FIGS. 10a and 10b describe the features incorporated for initialization and testing.

DETAILED DESCRIPTION OF THE INVENTION

Figure 1:
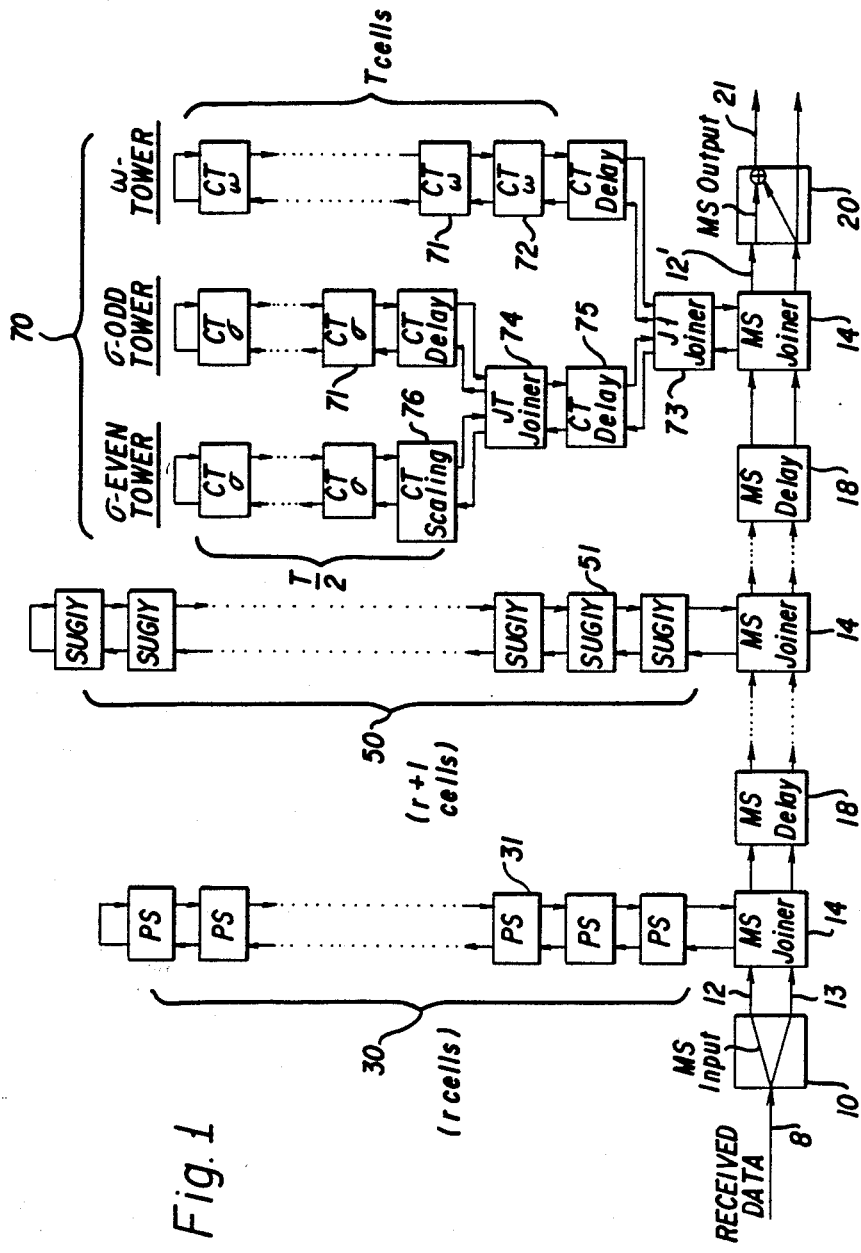
FIG. 1 is an architectural overview of the invention.

A convenient metaphor has been adapted in the design and development forming the basis of the present invention. While idiomatic to some extent, the descriptive value of the metaphor is deemed to be substantial and useful in forming a clear exposition. With this in mind, there is shown in FIG. 1 an architectural overview of the Reed-Solomon decoder of the present invention. An m bit wide initial data stream 8 (usually comprising possibly corrupted received data) is incident on junction module 10 and is split into two parallel data streams 12 and 13. One of these data streams (12) will be the object of processes which alter its substance to a stream of correction values while the other data stream (13) will be subject to delays imposed to maintain synchrony with its twin. The two data streams merge in data corrector module 20 producing a corrected m bit wide data stream 21.

The two data streams are regarded as propagating down "main street" comprising splitter module 10, digital delay lines 18, joiner modules 14 and corrector module 20. Data stream 12 includes the original m bit wide information component (which evolves through processing) together with additional bit(s) for control of the structures through which data stream 12 propagates. The character and function of the appended bits other than clocking information will differ in various components of the decoder. The data stream 12 evolves by propagation up and down "towers" encountered on that side of main street until that data stream has been transformed to a correction data stream 12'. The merging of the correction stream 12' with the correlated raw data stream 13 results in corrected data stream 21.

Splitter module 10 receives a byte wide (m bit) stream of datums from a source, not shown. In typical decoder usage the immediate source may be a de-interleaver. Splitter module 10 simply provides copies of this m bit wide data to each of its outputs forming the respective data streams 12 and 13. In what follows, the context will indicate whether the data stream, its constituent bytes, the appended control bit(s), or the serial byte/bit positions are the object of the labels 12 and 13. Splitter module 10 may also include simple means to generate an end-of packet-marker, eg. a signal marking the delineations between the codewords or blocks of data comprising the data streams and propagating as a one bit extension of the m bit wide data stream 12. The end-of-packet marker (EOPM) may alternatively be supplied by apparatus external to the input of the present decoder.

Corrector module 20 is essentially an XOR effectuator between two byte wide inputs producing a single byte wide output 21.

The several towers 30, 50 and 70 are located along the main street formed by digital delay lines 18 and joiner modules 14. Obviously, the functions represented by these towers are the essence of the error correction operation. Joiner modules 14 provide the coupling of the towers to main street. Both of these modules 14 and 18 may contain delay elements. The delay for the path 12 is a factor f less than that to be experienced by the path 13. The difference in delay prescribed for the two paths is simply the time required for processing in the several towers as the data stream 12 evolves to the correction stream 12'. A main street of m delay modules provides a delay of m cycles to the path 12 and mf cycles to the path 13. The differential delay of (m−1)f cyles corresponds to the time required for the error correction functions computation required between splitter module 10 and corrector module 20.

The delay units 19 associated with the data stream 13 and the delay units 19a associated with the correction stream 12 are implemented from flip-flops in straight forward manner. While delay in the correction stream may be distributed as indicated in FIG. 1, it is acceptable for such delay to be lumped into a single delay unit at any point prior to the corrector module 20.

The structure of the several "towers" generally contemplates propagation of the information stream 12 "up" the tower through a number of stages with appropriate processing at each stage and return propagation "down" and thence through a joiner module 14 to "main street". Thus the character of each of these towers corresponds to a folded systolic array having an up branch, a down branch and certain control structures between branches.

The present architecture is free of the constraints of global synchronization. Instead, clock pulses propagate through the array in a manner essentially parallel with the information stream. The manner in which information propagates "up" and "down" stages of the tower structures described herein requires, on closest scrutiny, that the individual component stages of the array comprising such towers accommodate separate information path portions corresponding to the up and down portions of the data flow. A first datum is processed in a given stage from input to output in a direction (up) parallel to the clock while concurrently a second datum is processed from a second input to a second output in a direction (down) anti-parallel to the clock propagation direction. The identical local clock governs the processing of both datums. The timing at the adjacent cells is therefore further constrained in respect to the concurrent requirements for both forward and backward directed data flow relative to the clock propagation direction.

The serialized structure here described has the property that the data output of any given component, or chip, is destined for communication with a single input, eg. a fanout of unity, with few noted exceptions. The clock channel is treated in similar fashion. Each chip receives a clock datum from its serial predecessor and passes that clock datum through a local (on chip) amplifier and thence to the serial successor chip. Separately, a local clock is derived from the serial propagating clock datum for the clocking functions native to the given chip. General timing considerations are described with the aid of FIG. 2 which depicts timing relationships of clock signals for successive chips. The phase difference in clock information between chips i and i+1 constitutes a delay d1 due to the amplifier on chip i and the conductor or "wire" delay for propagating the clock over passive conductors. That portion of the phase difference between arrival of a clock pulse at chip i and the availability of that clocking datum on chip i for local clock function is a quite small interval. There is also indicated on the timing diagram of FIG. 2 the timing interval during which the data processed on chip i departs chip i and subsequently arrives at the adjacent chip i+1. One critical time constraint must be maintained: from the point of view of chip i+1, the data leaving chip i must not change until after chip i+1 has available to it the local clock which caused the change at chip i. While provision for delay of the clock on chip i is one possible solution, it is apparent that this will not be appropriate in a typical systolic array. Such arrays are most frequently implemented with adjacent cells of substantially, if not exactly identical structure, such that delay of the incoming clock would be canceled by an identical delay on the subsequent chip. In the present invention it is preferred to latch the output data for the duration of the clock pulse and the output data is allowed to propagate only after the clock pulse has elapsed, eg. the trailing edge of the clock has occured. Thus after an interval d3, the remaining time of that clock pulse is available for the forward data flow through the array. Data flow in the opposite direction is accommodated within the constraints of d4, an interval for flip flop transitions for example, and leaving available the interval d5 to accommodate the set up of the datum of the backward flowing (with respect to the clock) data stream.

Serial propagation of clocking information through a plurality of gates would seriously degrade the clock pulse shape supplied to various cells of the array. Moreover, while the entire architecture is not synchronously constrained, there is a requirement for the clocking to maintain correlation with the data stream. In order to preserve the clock pulse shape, clock pulses are regenerated as described. At the input of an element of the array, the data stream 12 is required to be synchronous with the corresponding clock input in the sense that set up and hold times are satisfied for a register receiving the datum as clocked by the input clock.

It is sufficient to establish satisfactory clock regeneration that the regenerated clock pulses are triggered on the rising edge of the input and behave as a one-shot, yielding pulses of constant width independent of the width of the clock input. Specific clock regeneration arrangements are outside the scope of the this work, but are well known in the art.

It should be apparent that for the serialized array here described, there is no fixed synchronous relationship between component i and non-adjacent component i±2. Coherence, in the sense of a definite phase relationship between non-contiguous components rapidly deteriorates with the distance between such components. A most useful attribute of the architecture here described is that the progressive loss of coherence along the serialized array is balanced and symmetrized through the folded structure of the array ("tower") and the coherence which is gradually lost on one branch (upward) of the folded structure is gradually restored on the opposite (downward) branch. Thus at the level of "main street" the data flow of correction data path 12 and uncorrected data path 13 are again synchronous although no global synchrony constraint (parallel distributed or bussed clock pulses) has been applied.

FIG. 3a describes the structure of a general folded hypersystolic array. Data and control information enter the array at array entrance 25 comprising general cell labeled hs1 and propagate through r cells to array output cell 26, the terminal cell of the array. Clocking information enters cell 25 together with the control and data information and serially propagates to the center cell 27 of the array. General cells hsi and hs(r-i) are symmetrically distributed about the center 27 of the array of r cells. Each symmetrically distributed pair of cells are governed by a common clock signal. Additional interaction between cells hsi and hs(r-1) is indicated. This interaction may be in the nature of an arithmetical or logical dependence of the content of one such cell on the other. Examples of such interaction appear in the apparatus described herein.

In modern usage, cells hsi and hs(r-i) cohabit the same chip and reference to a cell or stage of such an array comprehends two anti-parallel data paths. Such an arrangement, topologically identical to FIG. 3a is shown in FIG. 3b. While the nature of the processing in either or both data paths of the array may be quite substantial in the logical or arithmetic sense, it should be appreciated that the process executed on the propagating datum at any stage may appear as simple as a "NOP" or mere delay. This would be the case where it is only desired to recover coherence in the second, or return path of an array after substantial processing encountered in the first path of the array. Another elementary processing operation is the marking of a specific datum with a value set in an accompanying bit, either stationary (specific to the cell) or also propagating, whereby to ascribe some attribute to that datum. It is more significant that the two clock-associated cells hsi and hs(r-i) may interact logically or arithmetically in the sense that the content of one such cell may be required to be a function of the content of the other. That is, the association of such cell pairs indicated in FIG. 3a may comprehend a data access as well as a common clock. It will be apparent that the folded hypersystolic structure, here described is widely applicable to systolic architectures without limitation to the error control application herein described.

It is apparent that an array of the the type shown may be arranged to provide for a selective length array merely by providing means for switching the data and control signals from propagation to the next stage (from cell i to cell i+1) to direct such data and control signals instead to cell (r-i). The ease with which such switching may be accomplished is evident in an implementation such as that of FIG. 3b.

Figure 3C:
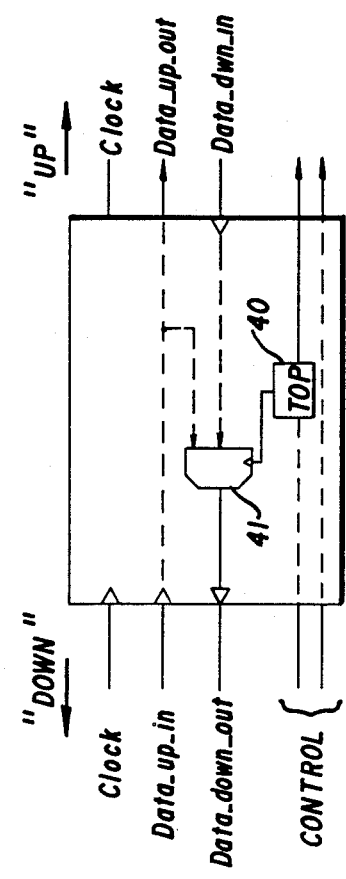

As shown in FIG. 3c, only a simple structural increment is required to provide a selectably variable length feature to the folded hypersystolic array. A state bit 40 is added to the hypersystolic cell. This state bit is a flip-flop selectable for each cell of the array. A control signal for this purpose is provided by an initialization procedure described below. Thus state bit 40 controls multiplexer 41 in such fashion as to select for the downwardly propagating output either of the downwardly propagating input from the next higher adjacent cell or the upward propagating data of the same cell which would otherwise be directed to the upward data input of the next adjacently upward cell. State bit 40 therefore controls whether the cell is logically the top ("fold") of the array.

The flexibility in array length need not be limited to an initialization procedure. For an appropriate application the length of such an array may be dynamically adjustable in response to a process dependent variable. For general iterative procedures of unpredictable length, the ability to so extend a calculation in progress is easily implemented in the described structure.

The structure referenced above as main street, is that of two synchronous, parallel data paths. The path 12 is interrupted to direct data and an accompanying clock and other control signals "up" a tower through a joiner module 14. The joiner module 14 also receives data propagating "down" from the tower. The joiner module 14 returns this tower output data stream to main street. The structure of the tower is such that the data returned from the tower is again synchronous with the corresponding data stream 13 which is subject to delay furnished by the joiner module 14 and/or delay module 18. The clock input to the joiner module 14 is regenerated to provide a local clock governing the operations of the joiner module and to furnish a clock output to be received by both the next adjacent main street module (usually delay line 18) and the tower affixed to that joiner. This fan-out of 2 is an exception to the unit fan-out found elsewhere in the apparatus. The essential arrangement is shown in FIG. 4.

Power sum tower 30 consists of r stages corresponding to the r power sums $S_i = R(\alpha^i)$ where R is the polynomial represented by a single packet of incoming data bytes and the $\alpha^i$ are roots of the generator polynomial of the code and $1 \leq i \leq r$. Annexed to the data stream 12 of incoming data is the end-of-packet marker (EOPM). This special control symbol may be regarded as a single bit extension of the m bit data field and serves to effectuate several control functions. For example, as the EOPM rises (EOPMUP) through the power sums tower 30, at each stage thereof, downward output from that stage is triggered. Other initializing operations are evident from a consideration of FIG. 5 which illustrates a representative cell or stage of the power sums tower 30. At initialization of the apparatus the x register 35 for the r-1-i stage will contain the quantity $\alpha^i$. As a new datum 12 enters the $i^{th}$ stage, several operations are carried out. Each cell or stage of the PST performs the following set of functions:

(a) The content of v register 38 is replaced by the sum of the content of z register 32 with the product of the content of x register 35 and y register 34, eg.

$$i^*y + z \rightarrow v$$

(b) The EOPM bit propagating in the upward direction (EOPMUP) is tested and if found true, the VALID bit is set. VALID may be regarded as a one bit extension of the m bit data propagating downwardly in the PST and thus comprises a further 1 bit extension of the v register 38.

(c) The one bit memory LASTEOPMUP is tested. This flip-flop contains a copy of the most recent value of EOPMUP (previous cycle). If LASTEOPMUP is true, the content of y register 34 is replaced with O and in the alternative, y register 34 is replaced with the expression $(x^*y + z)$, the content of the respective registers being intended. Thus this may be regarded as an initialization operation for the next encountered codeword and an iterative step within the current codeword processing.

(d) The content of EOPMUP (true or false) replaces the single bit memory LASTEOPMUP as indicated above.

The content of the x register 35 is a constant determined at initialization of the apparatus as discussed hereafter.

As the data bytes 12 pass "upwards" through the (r−1−i) stage codeword that stage computes $$\alpha^i(\alpha^i(\ldots \alpha^i R_N + R_{N-1} + \ldots) + R_1) + R_0 = R(\alpha^i)$$

The power sum cell 31 of FIG. 5 is driven by control signals PSC1 and PSC2 controlling multiplexers 34a and 37 respectively. The function of PSC1 is to select between an initial condition wherein the value 0 replaces the content of y register 34 at the initial step of iteration and the establishment of a closed feedback calculation from z register 32 through adder 33 to y register 34 through multiplexer 34a. This is accomplished by equating PSCI with a delayed version of EOPM.

In like manner PSC2 selects output from the cell 31 derived either from the DATA DOWN output of a higher cell, or from the calculation obtained in the present cell from the combination of the content of x register 35 (containing $\alpha i$) with y register 34 and z register 32. This output selection is accomplished with a pulse that leads EOPM by an appropriate interval. This interval and the PSCI delay noted above are implementation dependent, but for expository purposes, may be regarded as a single clock cycle.

A central function of the decoding process is the determination of those polynomials $\sigma(z)$ and $\omega(z)$ of minimum degree which satisfy the well known key equation $$(1 + S(z))\sigma(z) = \omega(z) \bmod z^r$$

where S(z) is the polynomial for which the coefficients are the power sums $S_i = R(\alpha^i)$.

Several methods are well known for locating solutions of the key equation. Some of the approaches of prior art are better suited to the Von Neumann architecture of conventional processors. An application of the Euclidean algorithm due to Sugiyama, Information and Control, v.27, pp87-99 (1975), has been implemented in a systolic architecture described by Brent and Kung, IEEE Trans. on Computers, v.c-33, pp.731-736 (1984) and Fisher et al, Proc. Third Caltech Conference on VLSI , Computer Science Press (1983). Constituent procedures underlying the Sugiyama-Euclidean algorithm are described by Berlekamp, op.cit.

In the hypersystolic architecture of the present invention, the Sugiyama algorithm is implemented in the "Sugy Tower" (ST) which receives the data stream 12 through joiner module 14.

A representative stage of the Sugy tower is shown in FIGS. 6a-6b. It may be remarked that the cells comprising the ST may be regarded as general computational devices, the functional requirements of which are well known to those of average skill in the art. FIGS. 6a-6b depict merely one way of serializing such a device and any particular internal organizational detail is not critical to the invention. Rather, the preferred hypersystolic implementation, evident in the input to, and output from such cells and the systolic organization and control regime are notable as an inventive contribution.

The ST 50 receives the power sums for computation of the coefficients of the error locator polynomial $\sigma$. The computation requires the presence of all power sums $S_i$ which latter are emitted from the PST 30 on every third clock cycle in inverse order from $S_{r-1}$ to $S_0$. The EOPM occurs on the next cycle following $S_0$. It is therefore necessary for the ST 50 to incorporate a memory element (RHOLD register 63) to retain the developing set of power sums $S_i$ until $S_0$ is available at the corresponding local cell. Thus the operation of the ST is sporadic. The nature of the output from ST 50 again appears on every third clock cycle except that the EOPM appears immediately following the last coefficient. Validity of any datum is affirmatively labeled by an -valid or $\sigma$-valid bit respectively (one of the respective coefficients tagged with a true value for the control bit VALID.)

FIG. 6b is a schematic description of the arithmetic/logic portion of an ST cell 51. Multiplexers 52a,52b,52c,and 52d determine the quantities furnished to the respective registers 53 (M2), 54 (M1), 55 (RBOT) and 56 (RTOP). Inter- register transfer paths are provided: for example, the content of M2 can be selected to replace the content of M1 and in like manner the content of RBOT can be directed to replace the content of RTOP. Thus the register contents of M1 and M2 can be swapped by appropriate commands C1 and C2 and the register contents of RTOP and RBOT may be swapped by the appropriate command structure C4 and C5.

The procedure executed by the ST 50 resembles the process for locating the greatest common denominator of $S(z)$ and $z^r$ except that the latter procedure continues until a vanishing remainder is generated.

It is known that implementation of the algorithm is expeditiously accomplished if the content of a single register contains related quantities selected to conserve register space and interregister transfers. Chapter 2 of the reference Algebraic Coding Theory at pp. 40–44 discloses a practice for packing such a working register with a pair of quantities such as $\omega_i$ and $\sigma_{i-1}$ or $\omega_{i-1}$ and $\sigma_i$. These packed quantities are symbolically separated by a "comma" which is physically realized in a separate register for the purpose of indicating the current partition of the working register. The packed quantities are characterized as the products of an iterative computation whereby one such parameter increases as the other decreases; thus the partition progresses across the working register from an initial to a final location while the content of the working register is shifted and combined through XOR operations with other operands. In the present work the working register is an aggregate of corresponding registers of several ST cells in hypersystolic relationship.

The solution of the Key Equation may be accomplished by different approaches as noted. The algorithm implemented by the ST 50 may be outlined as follows:

(a) initialize the following parameters for the iterative procedures to follow:

$$\sigma_{-1}(z) = 0$$
$$\sigma_0(z) = 1$$
$$\omega_{-1}(z) = z^r$$
$$\omega_0(z) = S(z)$$

(b) for $i = 1, 2, \ldots i_{max}$
Compute the partial quotient $Q_i(z)$ and $\omega_i(z)$ from $$\omega_{i-2}(z) = Q_i(z) \omega_{i-1}(z) + \omega_i(z)$$
subject to the constraint
degree $\omega_i(z)$ < degree $\omega_{i-1}$
and
$$\sigma_i(z) = \sigma_{i-2}(z) - Q_i(z) \sigma_{i-1}(z)$$
subject to the constraint
degree $\sigma_1$ < degree $\omega_i$
and the iteration termination for deg $\omega_j < r/2$.

A single multiplier 59 and single adder 60 are provided to perform the two sequential computations of the form $M_b * R_B + \text{RTEMP}(=0)$ and $M_a * R_A + \text{RTEMP}$ where subscripts a and b and A and B are merely meant to distinguish the respective register content as further indicated below. The necessary calculations are carried out over a local 3 cycle program governed by a mod 3 counter included in control generator 62. In accordance with this local program the following steps occur in the manner of an inner loop:

local cycle 0:
M2 is acquired (from the previous cell or main street). M1 is initialized.

local cycle 1:
The product of M2 with RTOP is formed and

M2*RTOP+(0)→RTEMP.

Concurrently, RBOT is acquired from the cell above ( or initialized).

local cycle 2:
The product of M1 with RBOT is formed and added with RTEMP and

M1* ROBOT + RTEMP → RTEMP
RTOP → RBOT
RBOT → RTOP

The combination of operands to pair the multiplier M1 or M2 with a working register RTOP or RBOT is further affected by the partition of that working register. Briefly, the content of the working register to one side of the "comma" forming one partition, is subject to one multiplier while the portion to the other side of the comma, eg. the other partition is subject to the other multiplier. The manner in which this partition is controlled in the present hypersystolic implementation will be presented elsewhere herein with a specific example. Two internal state bits, STOP and SBOT, provide markers for varying the partitions of the aggregate registers of which RTOP and RBOT are component portions. The bits STOP and SBOT may be regarded as partition markers in the same sense for the respective registers RTOP and RBOT. The relative alignment or displacement of these delimiters is recorded in another local quantity $\Delta$. In the present model, the quantities and $m_2$ are combined to yield another internal state variable, referenced as "star" in the definitions below of control signals c2, c4 and c5. The method of register partition is not an essential element of a hypersystolic array for solving the Key Equation, nor even for solving the Key Equation via the Sugiyama Algorithm. It is a convenient and compact approach which conserves semiconductor area and minimizes inter-register transfers which might be required otherwise.

After R repetitions of this basic sequence (analogous to an outer loop) the sequence of coefficients will have been formed on the downward path and the corresponding VALID bits set.

FIG. 6a illustrates the input/output and control generation structure for the ST cell 51. In particular control/command generator 62 receives the local clock, VALIDUP (from the PST), EOPM and system initialization signals. It is preferred to regenerate many commands and control signals at the local cell to conserve pin-out resources and reduce the number of essential propagating signals. Included within the control/command generator 62 is a simple mod 3 counter for establishment of the basic local cell sequence and also certain flip-flops for identifying the local cell by position within the array (bottom cell, top cell, or intermediate position). One of average skill in the art will recognize that implementation of the necessary local control logic is a straight forward exercise in arranging bistable devices and gating structures within control generator 62 to provide the required conditions subject to the general timing rules of FIG. 2.

. The ST cell 51 regenerates and originates local status bits and control signals to route datums through the several multiplexers for producing required combinations of arguments at multiplier 59 and adder 60 at the correct point in a calculation sequence. The function of control generation module 62 (FIG. 6a) is most succinctly described in the form of truth tables defining the control codes c1-c8, inclusive, presented below for the respective multiplexers. These define entirely the cell operation for a model form of ST 50. Certain internal state bits are created (or simply regenerated) within control generator 62. To some extent these internal states are implementation dependent and in another implementation some of these internal control bits might prove unnecessary or might be supplanted by a rather different set of control bits. For example, "top" and "bottom" are indicators of the relative position of a physical cell in an array. In the preferred embodiment, these control bits are set at system initialization using a system configuration feature described below. In this manner the logical requirements for any of a class of error correcting codes of varying parameters may be accommodated in the essentially variable length hypersystolic arrays forming the component structures of the present error correcting decoder. The need for a local cell control bit such as top is clear where for example a DATA DOWN input is to be obtained from a next higher cell and there is no such "higher" cell. Such a control bit would be irrelevant in a specialized array of fixed length wherein functional properties of the "top" cell would most certainly be implemented in organic cell structure. In the preferred embodiment, cell position information is derived from a two bit quantity "cp") set at system initialization and retained internally to identify the position of the local cell in the presently configured array. This is essentially a constant and identifies the local cell as top cell, botttom cell, next-to-top cell, or none of the foregoing. Control signals c1 and c5 are sensitive to the identity of the local cell as bottom or top respectively.

Control signal c10 has the purpose of acquiring the respective input datum ($S_i$) for the local cell, sti, while assuring that the next higher cell st(i+1) will ignore $S_i$ and wait for its proper datum ($S_{i+1}$). When c10 is generated, the proper datum is received from the data stream while control generator 62 resets the VALID bit to be passed to the next higher cell causing that cell to ignore the accompanying datum.

Control signal c11 serves much the function described by TOP control bit 40 (FIGS. 5 and 7). That is, c11 provides an EOPM for downward propagation where the particular cell is, in fact, the top cell of the array.

Control signal c12 regenerates the VALID status level. The VALID outputs created by the ST 50 occur synchronously with a modulo 3 clock generated by the control generator 62. C12 requires that EOPMUP has reached the top cell of the array.

Several of the remaining control signals to be discussed are also functions of local state bits which reside in control generator 62 for the exemplary implementation. Many of these local control signals are quite straightforward. For example "cycle" is a 2 bit number generated by the local mod 3 clock.

An example of the command structure may be examined for the case of the C1 control signal for selecting the content of M2 register 53 at various times. The definition of C1 is summarized in the following truth table as a logical combination of the local clock (mod 3 counter) and the relevant control signals (here EOPM and the internal flip-flop "bottom" which marks the local cell as adjacent main street or not):

TABLE 1

Truth Table for C1 (MUX 52A)

| Cycle | EOPM_UP | cp=bottom cell | Result |
|---|---|---|---|
| x | 1 | 1 | ROUT |
| x | 1 | 0 | DATA_UP |
| 0 | 0 | 1 | ROUT |
| 0 | 0 | 0 | DATA_UP |
| | else→ | | M2 (previous value) |

It is thus apparent from the above that certain conditions are cycle specific and cell specific while other conditions are indifferent to either the local cycle or cell location.

In the tables 1-8 the identity of the signal to be switched by the respective multiplexer is given under the heading "Result" as a function of the logical variables indicated. The value x for a logical variable stands for any value (other than specified elsewhere in the table). "Else" refers to any combination of values of logical variables other than specified elsewhere in the table.

TABLE 2

Truth Table for C2 (MUX 52B)

| cycle | EOPM | star | Result |
|---|---|---|---|
| x | 1 | x | ONE |
| 0 | 0 | 1 | M2 |
| Else → | | | M1 |

TABLE 3

Truth Table for C3 (MUX 57)

| cycle | EOPM_UP | NXTS_TOP | S_BOT | Result |
|---|---|---|---|---|
| x | 1 | 0 | x | M2 |
| x | 1 | 1 | x | M1 |
| 2 | 0 | x | 1 | M2 |
| 2 | 0 | x | 0 | M1 |
| 0 | 0 | 0 | x | M2 |
| 0 | 0 | 1 | x | M1 |
| Else → | | | | M1 |

TABLE 4

Truth Table for C4 (MUX 52C)

| cycle | S_TOP | S_BOT | star | Result |
|---|---|---|---|---|
| 2 | x | x | x | DATA_DOWN |
| 1 | 0 | 1 | 1 | RTEMP |
| 1 | 1 | 1 | 1 | RTOP |
| Else → | | | | RBOT |

TABLE 5

Truth Table for C5 (MUX 52D)

| cycle | EOPM_UP | TOP_CELL | S_TOP | S_BOT | STAR | Result |
|---|---|---|---|---|---|---|
| x | 1 | 1 | x | x | x | ONE |
| x | 1 | 0 | x | x | x | 0 |
| 1 | 0 | x | 0 | 0 | 1 | RBOT |
| 1 | 0 | x | 1 | 0 | x | RTEMP |
| 0 | 0 | x | 0 | 1 | 1 | RTEMP |
| 0 | 0 | x | 1 | 1 | x | RTEMP |
| Else → | | | | | | RTOP |

TABLE 6

Truth Table for C6 (MUX 58)

| cycle | EOPM_UP | Result |
|---|---|---|
| x | 1 | RTOP |
| 2 | 0 | RBOT |
| 0 | 0 | RTOP |
| Else → | | RTOP |

TABLE 7

Truth Table for C7 (MUX 61)

| cycle | S_TOP | S_BOT | Result |
|---|---|---|---|
| 2 | x | x | 0 |
| 1 | 0 | 0 | 1 |
| 1 | 1 | 1 | 1 |
| 1 | 0 | 1 | 0 |
| 1 | 1 | 0 | 0 |
| Else → | | | 1 |

TABLE 8

Truth Table for C8 (MUX 63)

| Cycle | EOPM_UP | S_TOP | S_BOT | Result |
|---|---|---|---|---|
| x | 1 | x | x | PS |
| 1 | 0 | x | 0 | RTEMP |
| 1 | 0 | x | 1 | RBOT |
| 0 | 0 | x | x | DATA—DOWN |
| Else → | | | | ROUT |

Whereas the PST 30 produces valid output at the rate of r power sums per codeword and the ST 50 produces valid error locator and error valuator polynomial coefficients at the rate of r+1 coefficients per codeword, the correction tower, or CT 70 produces a stream of correction symbols on a one for one basis with the codeword symbols. The value of the correction symbols will be determined by the CT 70 to be zero-valued symbols for locations free of error, and the proper correction value for restoring to corrected status the erroneous values at locations determined to The principal functions of the CT 70 are separation of the $\sigma$ and $\omega$ coefficients of the data stream received from ST 50, evaluation of the respective polynomials, comparisons of the evaluated quantities $\sigma_e(x)$ and $\sigma_o(x)$, and the computation of the correction quantity for application to respective datums of data stream 13.

The correction tower 70 consists of three separate hypersystolic array subtowers for processing separately the coefficients of the $\omega$ polynomial and the segregated even and odd coefficients of the $\sigma$ polynomial. The component cells 71 of the three subtowers are identical as described below.

The information stream entering the CT 70 from the ST 50 includes the coefficients of $\omega(x)$ preferably arranged high order to low order, followed by the coefficients of $\sigma(x)$ preferably arranged low order to high order. Each of these m bit coefficients is accompanied by a corresponding field extension representing a validity identifier.

In the upward direction the J1 joiner 72 passes the train of all coefficients to the $\omega$ subtower 70c while only the $\omega$ coefficients retain that VALID true status in that subtower. All datums emitted by the ST 50, eg. the data stream 12, are incident on the J1 joiner, but only 2T+1 of these symbols bear true valued VALID bits. The first T of these are the $\omega$ coefficients and the next T+1 are identified as such in an analogous operation at the J2 joiner. Recognition and re-validation is accomplished with the aid of a gating structure exemplified by the simple arrangement of FIG. 7b. The first T of the VALIDUP true coefficients incident on this portion of the J1 joiner are recognized with the aid of the t counter and will be treated within the $\omega$ subtower 70c as such. The $\sigma$ coefficients, which bear a VALID true tag (set originally by ST 50) preserve that tag as indicated by FIG. 7b. A similar gating structure in combination with a mod 2 counter at the J2 joiner 74 alternately tags the even coefficients and odd coefficients of o for their respective subtowers. It should be recognized that the same information stream propagates in all three of the subtowers, but the different significance of the VALID bit in the three subtowers serves to identify the correct datums to the respective subtowers 70a (for $\sigma_e$), 70b (for $\sigma_o$) and 70c (for $\omega$).

The set of cells 71 accepts the upward directed data and upon acquiring a complete set (of $\omega$'s and $\sigma$'s) evaluate the $\omega$ polynomial and the separate portions of the σ polynomial. The structural similarity of cells 71 and 31 is due to their quite similar functional requirements.

The incidence of an error location is determined from the error locator polynomial σ(x) through examination of the even and odd coefficients of σ(x). The roots of σ(x) are error locations and for such error locations the even and odd constituents of σ(x) sum to zero:

$$\sigma_e(x) + \sigma_o(x) = o(x = \text{error location})$$

In order to produce the correction quantity Y(x) corresponding to an error location x it is necessary to obtain the quantity σ'(x). Fortunately this latter quantity may be obtained from the relationship $$x \, \sigma'(x) = \sigma_o(x)$$

(See Berlekamp, op.cit.) Thus a strategy for efficient operation prescribes separating the σ and ω coefficients from the valid ST output, further separating the valid ST output into even and odd coefficients of σ and comparing same to ascertain whether $\sigma_e(x) + \sigma_o(x) = 0$ for all possible locations x. A non-zero result for the latter can be used to force a zero-valued correction value to be emitted from the CT to correction stream 12'. A zero result of $(\sigma_e + \sigma_o)$ causes the generation of the σ'(x) and the division of ω(x) by σ'(x) to yield the proper correction value Y (x) for the errata at x.

The ultimate function of the correction tower is the computation of the error correcting quantity $$Y(x) = \omega(x)/\sigma'(x)$$

The above quantity added ( eg.XORed) to the quantity at the location x yields a corrected quantity. Most commonly, the quantity to be added to the received value at location x is simply 0. This will be the case where the evaluation of the even and odd parts of the σ polynomial at the location x do not yield identical results. A simple compare establishes the truth or falsity of that condition. Where the relationship $\sigma_e(x) = \sigma_o(x)$ the above division operation is required.

The evaluation of the polynomials in the correction tower is carried out with the aid of a simple cell such as shown in FIG. 7a in a manner similar that of the PST cell 31. The correction tower has the advantage of simplification evident in the basic correction cell 71. The correction tower 70 processes all quantities without selective routing of datums at the cell level. Compare the cell of FIG. 7a with the PST cell 31 of FIG. 5 and notice the absence multiplexers in the cell 71. Partly this is due to the de-centralized architecture of separate subtowers for processing respective coefficients $\omega, \sigma_e$ and $\sigma_o$.

Known inversion and multiplication apparatus may be employed to implement the above described division. In the present invention, it is preferred for this division to be carried out with synthesized, or quasi-division operations in the CT joiners 73 and 74. Division is a cumbersome numerical operation as usually implemented. One may regard a division operation as the sequential operations of inversion of the quantity representative of the divisor and multiplication thereof by the quantity representative of the dividend. These are quite dissimilar operations, to be carried out over the full precision of the respective quantities in a conventional $GF(2^m)$ implementation. In the present work it is found that an effective division operation can be obtained with the cascade of two rather similar operations (quasi-divisions) thereby yielding an advantage in any specific implementation. The most advantageous aspect of the cascade of two similar operations is that the same structure may be used twice thus requiring only one type of cell for the purpose, or that only one type cell arranged in tandem will accomplish the desired computation with no more complexity than a conventional implementation for the division.

Turning now to FIG. 8a, there is illustrated the process by which a synthesized division of the form A/B is obtained through a sequence of quasi-divisions of the present invention. The m bit divisor B is directed on one branch to norm generator 102 from which there is obtained the m/2 bit quantity ΔB. The norm function is defined and its properties demonstrated by Lidl and Niederreiter, Finite Fields, Encyclopedia of Mathematics, v.20, G. Rota, ed., Addison Wesley (1983). The quantity B is then inverted through inverter 104. This m/2 bit quantity is then supplemented with m/2 zero valued bits and combined with the original m bit quantity B in quasi-divider 106 to obtain a quantity B ○ $(1/\Delta B)^{-1}$. This intermediate result is then directed to the second quasi divider 108 and combined therein with quasi-dividend A. It can be demonstrated that on the finite field these operations are equivalent to the division A/B.

The quasi divider structure 106, 108 is structurally similar to a multiplier. In FIG. 8b the essential structure of a finite field quasi-divider specialized to the case m=6 is illustrated and compared with the finite field multiplier of FIG. 8c. The two structures exhibit similarity in similar constituents although there is a strong distinction in the character of the mathematical result produced. Both structures employ m/2 bit (XOR) adders 109a, 109b, 109c, and 109d; $GF(2^{m/2})$ multipliers 110a, 110b and 110c; and $GF(2^{m/2})$ constant multiplier 111a and 111b. (The constant (β) multiplier 111a is dependent upon the representation of the field.) The arguments upon which this apparatus operates comprise m bit quantities (m even), each expressed as a pair of ordered m/2 bit quantities. The arithmetic operations internal to the device are carried out on the field $GF(2^{m/2})$ and the result is supplied in an ordered pair $(R_0, R_1)$ each component also defined over $GF(2^{m/2})$.

In the general case, eg. any even value of m, the generalized structure corresponding to FIG. 8b will retain the arrangement of the multipliers 11a, 11b, and 11c cooperating with adders 109c and 109d. The generalization is in means for forming linear combinations independently in the arguments, and in the representation-dependent quantities β and the associated multiplier(s) 111.

The internal arrangement of the path between adder 109b, multiplier 110a and the input data quantity B₀ cause a distinctive set of partial results in FIG. 8b. It can be demonstrated that the output of a quasi-divider of the present invention as exemplified in FIG. 8b for m=6 is given as $$A \bigcirc B = (A/B) \Delta B$$

where the symbol ○ denotes the quasi-division operation. It is therefore apparent that the operation yields something more than the finite field quotient (hence the nomenclature) by a factor identified as the norm of the argument of the divisor.

Accordingly, a synthesized division, for yielding a proper finite field quotient must compensate the presence of this factor by conditioning the argument B. This conditioning is achieved by another quasi-division as indicated, together with the generation and inversion of the norm of B. Thus, a proper finite field division is synthesized as $$A/B = A \bigcirc (B \bigcirc 1/\Delta B)$$

The nature of the elementary operation $A \bigcirc B$ can be regarded as a finite field product of the finite field quantities A and the conjugate of B.

EXAMPLE

In order to describe the operation of the invention as a whole, it is useful to describe such operation within the context of the most simple non-trivial example of a system for practice of the invention. It must be appreciated that this simplification is not a simplification of the elementary components of the system, it merely simplifies the overall complexity of a representative system. The structure of the array elements is identical whether the system configured is a simple one as described below or whether a practical arrangement of greater complexity is implemented. The relationship of simple to complex systems is itself illustrative of the great flexibility afforded by the inventive structure.

Consider a simple 7,2 code, eg. $n=7$ and $r=2$, defined on the field $GF(2^6) = \{0, \alpha^0, \alpha^1, \alpha^2, \ldots, \alpha^{63}\}$. Merely for reference purposes in following the algebraic manipulations on the field as defined, the elements and their logarithms are arranged in FIG. 9a in logarithmic order and in FIG. 9b in elemental order. The logs are stated in decimal and the elements are stated in hexadecimal notation, eg. element $= \alpha^i$, $\log = i$.

This code describes a 7 character codeword incorporating redundancy $r=2$. The error correcting capability for such code is $r/2=1$ character. The roots of this code are $\alpha^1$ and $\alpha^2$. For the exposition of a simple example, a representative code word will be examined as it progresses through the example apparatus. The example codeword will be an all zero word at the data source, eg. as transmitted. The word will be serialized at the transmitter to occupy 7 consecutive time increments numbered 0 through 6. It will be assumed that the communications channel introduces an error at time increment 3, that is, the information occupying the fourth time increment of the serialized information is distorted and at the receiver the received information is $$0,0,0,\alpha^{54}, 0,0,0$$

Referring back now to FIG. 1, a serialized copy of the received codeword is obtained at splitter 10 and this copy of the received data propagates over the lower path comprising the joiners 14 and delays 18 forming main street.

The upper path is diverted to enter each of the towers propagating up and down same and exiting to main street. This path includes a 6 bit wide data channel (per example), a separate clock channel of 1 bit, and another 1 bit channel for the marker bit EOPM. The 1 bit marker VALID is generated initially on the downward path of the PST 30 and may thereafter be regarded as an extension of the data byte. VALID is redefined on the downward path of PST 50. In time sequence, EOPM is 0 at all times corresponding to the 7 consecutive time intervals occupied by the codeword, and becomes 1 in an eighth interval for the duration of the interval (or inter-codeword gap).

The function of the PST 30 is to produce the power sums, eg. expressions of the form $$S_j = \sum_{i=0}^{n-1} Y_i (\alpha^{j+L})^i \quad 0 \leq j \leq r-1$$

The choice of the parameter L is discussed by Berlekamp, op.cit. The present system requires but 2 stages for its PST because the redundancy $r=2$. These quantities are expressed as polynomials, as is the data. In the PST portion of the apparatus, the computed power sums are output by each cell at respective times to form a train of power sum coefficients which propagate toward the next (Sugy) tower. The 6 bit wide data is copied to the z latch 32 of a PST cell and the output of z latch 32 is split to supply the datum to the next cell, and also to provide the datum for the serial computation to proceed in the present cell. The nature of the computation is to accumulate the quantity $x*y+z$.

It is clear from FIGS. 5a and 5b that in addition to the m bit wide (here, 6) data path propagating through each PST cell, there is a clock (1 bit) and the marker control signal EOPM (1 bit). Another propagating control signal, VALID, is generated (initially) by the PST 30 to indicate that the concurrent PST output information is in fact valid computational output (a power sum of the present codeword). A false value of VALID simply marks the empty cycles during which the computation is evolving. During this interval, the output contains spurious information. Clearly, for a 7 character codeword input and a 2 character set of power sums, there will be 5 irrelevant characters in the output stream from the PST 30 for each codeword.

For the present example, the PST 30 comprises 2 cells denoted ps1 and ps2 and the received (erroneous) word is represented by the polynomial $$Y(x) = \alpha^{54} x^3$$
Cell $ps\_1$ evaluates $Y(x)$ at $x = \alpha^2$, thus:
$$S_2 = Y(\alpha^2) = \alpha^{54} (\alpha^2)^3 = \alpha^{60} = 3B$$
Cell $ps\_2$ evaluates $Y(x)$ at $x = \alpha^1$, thus:
$$S_1 = Y(\alpha^1) = \alpha^{54} (\alpha^1)^3 = \alpha^{57} = 19$$

The above may be verified with the aid of the field tables (FIGS. 9a and 9b). The time evolution for this computation is shown below in tables 9. The root $\alpha^2$ is retained by the x register 35 of cell PS1 and computation commences with the occurrence of EOPM. The register y accumulates a result which is directed to the data output ( the "downward" direction) coincident with the occurrence of EOPMUP. The same calculational procedure occurs in cell PS2 delayed by 1 cycle with respect to PS1. In PS2 the corresponding x register 35 contains the cell constant $\alpha^1$. The calculations from the respective cells form the output $S_2$, $S_1$ in that order. In a certain sense the folded hypersystolic arrays may be said to exhibit a first-in first-out character in a preferred embodiment. In table 9b the computation occurring in PS2 is shown.

TABLE 9a

| t | EOPM | x | y | z | y*x+z | data down | EOPM | x | y | z | y*x+z | data down |
|---|---|---|---|---|---|---|---|---|---|---|---|---|
| −1 | 1 | $\alpha^2$ | 0 | — | 0 | — | 0 | $\alpha^1$ | 0 | — | 0 | — |
| 0 | 0 | $\alpha^2$ | 0 | 0 | 0 | — | 1 | $\alpha^1$ | 0 | — | 0 | — |
| 1 | 0 | $\alpha^2$ | 0 | 0 | 0 | — | 0 | $\alpha^1$ | 0 | 0 | 0 | — |
| 2 | 0 | $\alpha^2$ | 0 | 0 | 0 | — | 0 | $\alpha^1$ | 0 | 0 | 0 | — |
| 3 | 0 | $\alpha^2$ | 0 | $\alpha^{54}$ | $\alpha^{54}$ | — | 0 | $\alpha^1$ | 0 | 0 | 0 | — |
| 4 | 0 | $\alpha^2$ | $\alpha^{54}$ | 0 | $\alpha^{56}$ | — | 0 | $\alpha^1$ | 0 | $\alpha^{54}$ | $\alpha^{54}$ | — |
| 5 | 0 | $\alpha^2$ | $\alpha^{56}$ | 0 | $\alpha^{58}$ | — | 0 | $\alpha^1$ | $\alpha^{54}$ | 0 | $\alpha^{55}$ | — |
| 6 | 0 | $\alpha^2$ | $\alpha^{58}$ | 0 | $\alpha^{60}$ | — | 0 | $\alpha^1$ | $\alpha^{55}$ | 0 | $\alpha^{56}$ | — |
| 7 | 1 | $\alpha^2$ | 0 | 0 | 0 | $\alpha^{60}$ | 0 | $\alpha^1$ | $\alpha^{56}$ | 0 | $\alpha^{57}$ | — |
| 8 | (next codeword for cell 1) | | | | | | 1 | $\alpha^1$ | 0 | 0 | $\alpha^{57}$ | $\alpha^{57}$ |

TABLE 9b

| t | EOPM | x | y | z | y*x+z | data down |
|---|---|---|---|---|---|---|
| −1 | 0 | $\alpha^1$ | 0 | — | 0 | — |
| 0 | 1 | $\alpha^1$ | 0 | — | 0 | — |
| 1 | 0 | $\alpha^1$ | 0 | 0 | 0 | — |
| 2 | 0 | $\alpha^1$ | 0 | 0 | 0 | — |
| 3 | 0 | $\alpha^1$ | 0 | 0 | 0 | — |
| 4 | 0 | $\alpha^1$ | 0 | $\alpha^{54}$ | $\alpha^{54}$ | — |
| 5 | 0 | $\alpha^1$ | $\alpha^{54}$ | 0 | $\alpha^{55}$ | — |
| 6 | 0 | $\alpha^1$ | $\alpha^{55}$ | 0 | $\alpha^{56}$ | — |
| 7 | 0 | $\alpha^1$ | $\alpha^{56}$ | 0 | $\alpha^{57}$ | — |
| 8 | 1 | $\alpha^1$ | 0 | 0 | $\alpha^{57}$ | $\alpha^{57}$ |

The Sugiy cell is schematically represented in FIGS. 6a and 6b. The implementation of the functions required for the ST 50 is not critically limited to the structure here described except for the hypersystolic implementation. FIG. 6a merely illustrates the upward and downward propagation of control signals on the individual cell. In FIG. 6b, there is shown a schematical representation of the operative portion of such cell. Major active registers RTOP 52 and RBOT 51 are selectable through MUX 53 to supply one operand to multiplier 54. In like manner the other operand for multiplier 54 is selected from active registers M1 and M2 through MUX 57. MUXs 58, 59, 60 and 61 each provide means for selecting the content of the registers M1, M2, RTOP and RBOT from prior values of the same registers or from DATAUP or DATADWN, intermediate results and the like. One recognizes that the various multiplexers are available to steer certain datums to operational elements such as the multiplier 54 and the adder 62. In this sense the ST cell 51 of FIGS. 6a and 6b describes a simple arithmetic unit for performing the Euclidean algorithm and computing the coefficients of the polynomials $\sigma(x)$ and $\omega(x)$. For the simple example of the 7,2 code serving as a pedagocical model, $\sigma(x) = \sigma_1 x + \sigma_0$ and $\omega(x) = \omega_0$. In this example, the ST 50 comprises 3 stages (cells) for which relevant computational steps are occurring in the several cells concurrently. The input data comes from the PST and for the simple model the result of tables 1a and 1b indicate the power sums $S_1 = \alpha^{57}$ and $S_2 = \alpha^{60}$. For examining the operation of the ST 50 for the simple case, the input data string appears serially as

| time → | 0 | 1 | 2 | 3 | 4 | 5 | 6 | 7 | 8 |
|---|---|---|---|---|---|---|---|---|---|
| EOPM | 1 | 0 | 0 | 0 | 0 | 0 | 0 | 0 | 1 |
| DATA | 0 | — | — | $\alpha^{60}$ | — | — | $\alpha^{57}$ | — | — |
| VALID | 0 | 0 | 0 | 1 | 0 | 0 | 1 | 0 | 0 |

The ST 50 produces the polynomial $\sigma$ comprising 2 $\sigma$ coefficients (appropriate to r/2+1 where r=2 in the simple example) and the polynomial which is but a single coefficient owing to the single error correcting capability of the example. This data stream may be considered as follows;

| (relative) time → | 0 | 1 | 2 | 3 | 4 | 5 | 6 | 7 | 8 |
|---|---|---|---|---|---|---|---|---|---|
| EOPM | 1 | 0 | 0 | 0 | 0 | 0 | 0 | 0 | 1 |
| DATA | 0 | $\sigma_0$ ($=\alpha^{51}$) 2E | 0 | 0 | $\sigma_0$ ($=\alpha^{57}$) 19 | 0 | 0 | $\sigma_1$ ($=\alpha^{60}$) 3B | 0 |
| VALID | 0 | 1 | 0 | 0 | 1 | 0 | 0 | 1 | 0 |

It will be of some interest to examine how the above output data stream is developed by the model ST for this example. This is illustrated with the aid of FIGS. 10a through 10g inclusive. At FIG. 10a the ST of the example, comprising 2r+1=3 cells has been initialized in the current block containing the example error. As indicated previously, R repetitions of the basic 3 cycle sequence are required; thus after 6 cycles have been counted, the ST process is complete. Each of the six illustrations labeled FIG. 10a-10g is labeled by the clock cycles $\phi_1=0,1,2$ and $\phi_2=0,1,2$ where the subscript labels the set of local clock cycles. In the illustrations 10a-10g the individual boxes represent the content of the registers of the ST cells st1, st2 and st3. Each cell is represented by its local registers STOP (1 bit), RTOP (m bits), RBOT (m bits) and S BOT (1 bit). The content of the cell registers is shown symbolically and to the right of the figure there is shown the respective numeric quantities. The quantities $S_1$ and $S_2$ are received from the PST 30 and the results are developed in the manner shown for processing by the CT 70. In considering the FIGS. 10b through 10g, the reader is reminded that the illustrations are not to be regarded as a conventional snapshot of the several registers at an instant of time. Rather these illustrations may be regarded as showing the condition of the related registers interpreted on a staggered time scale; that is the registers RTOP and RBOT of each of the three cells comprise in the aggregate, composite (hypersystolic) registers rtop and rbot in hypersystolic relationship. The content of M1 propagates on the upward path. The power sums are also distributed to the respective cells via the upward directed path (st1→st2→st3). Over the downward path (st3→st2→st1) the contents of the RBOT registers are shifted and finally the $\omega$ and $\sigma$ coefficients are shifted out to main street.

The comma is interpretable as located at the transition in value of the content of SBOT between adjacent cells and similarly for the cells STOP.

The correction tower accepts the data stream above and validates the $\omega$ datums into the $\omega$ subtower and the $\sigma_e$ and $\sigma_o$ subtowers respectively. The substreams $\sigma_e$ (here 1 coefficient), $\sigma_o$ (also 1 coefficient) and $\sigma_o$ richochet from the tops of their respective subtowers and are evaluated for each location $x_i$ of the codeword. The location $x_i$ is defined for each value of the index i, $0 \leq i \leq 6$, such that $x_i = \alpha^{-i}$. The resulting data streams are summarized below:

| (relative) time → | 0 | 1 | 2 | 3 | 4 | 5 | 6 |
|---|---|---|---|---|---|---|---|
| x | $\alpha^{-6}$ | $\alpha^{-5}$ | $\alpha^{-4}$ | $\alpha^{-3}$ | $\alpha^{-2}$ | $\alpha^{-1}$ | $\alpha^0$ |
| $\sigma_e(x)$ | $\alpha^{57}$ | $\alpha^{57}$ | $\alpha^{57}$ | $\alpha^{57}$ | $\alpha^{57}$ | $\alpha^{57}$ | $\alpha^{57}$ |
| $\sigma_o(x)$ | $\alpha^{54}$ | $\alpha^{55}$ | $\alpha^{56}$ | $\alpha^{57}$ | $\alpha^{58}$ | $\alpha^{59}$ | $\alpha^{60}$ |
| $\omega(x)$ | $\alpha^{51}$ | $\alpha^{51}$ | $\alpha^{51}$ | $\alpha^{51}$ | $\alpha^{51}$ | $\alpha^{51}$ | $\alpha^{51}$ |

It is observed that $\sigma_e(x) = \sigma_o(x)$ at $x = \sigma^{-3}$. Thus the correction to be supplied at all values of t (relative) other than t=3 is 0. At the location t=3 the selected values are combined to form $$Y(x) = \frac{\omega(x)}{\sigma_o(x)/x}$$

The quantity is formed in two steps ( according to the quasi division described above if the datum width comprises an even number of bits, or alternatively with a conventional finite field inversion and multiplication to yield $$\alpha^{51}/(\alpha^{57}/\alpha^{-3}) = \alpha^{54}$$

At $t=3$ ($x=\alpha^{-3}$) the uncorrected data stream contains the error pattern $\alpha^{54}$. The XOR with the error value $\alpha^{54}$ gives 0, the corrected datum.

INITIALIZATION AND TESTING

Testing apparatus such as has been described above poses a formidable problem. Logically, the magnitude of the number of elemental functional components make it unlikely that a specific defect will yield a corresponding response for a particular set of test data. There is a further difficulty in separately addressing desired elements or groups of elements. In a preferred construction of the present invention, VLSI implementation is a convenient and economical approach. It is known in the design of VLSI chips to include logic circuitry for the dedicated purpose of testing on-chip components. One class of such testing techniques is known as "signature analysis" and comprehends applying logic test patterns to the logic components of the application circuits (hereafter, "user logic"), observing the resulting signals at particular test points and comparing same with corresponding operational responses resulting from user logic known to operate properly. Signature analysis is a straightforward comparison of real-time response for a test circuit and a reference circuit known to exhibit no defects. Signature analysis and like design in test schemes are principally used for large gating structures.

In the present invention, bistable components of user logic, eg. flip-flops and the like, are each provided with an additional multiplexer (MUX) interposed between the bistable element (hereafter, flip-flop) input and that user logic signal ordinarily connected to the flip-flop input. An alternative input is therefore available for the flip-flop through the MUX when a select signal to the MUX so directs. The alternative signal is derived from a fanout at the output of some other flip-flop. For one flip-flop it is apparent that the input is derived from some external source. In like manner there will be one flip-flop which provides an output to an external sink. All of the flip-flops in the user logic are therefore configurable to implement an effective shift register by simultaneously enabling the alternative input of the several respective MUXs. A completely specified set of initial conditions can be propagated through the effective shift register to establish desired states of certain logic and to furnish prescribed numeric constants to certain registers: thereafter the normal inputs for the corresponding MUXs can be selected for normal user logic operation taking the now initialized states of the user logic components as initial conditions for normal operation. In like manner, operation of the user logic may be suspended and the alternative MUX inputs enabled to establish the effective shift register. The states of the effective shift register are then shifted through the effective shift register to a receiving register or memory to preserve the state of the user logic at that instant when it was suspended for the purpose of this diagnostic procedure.

For the preferred embodiment of the RS decoder of the present invention, component VLSI chips (or like components) are provided with a first additional pin for the shift-in signal, a second additional pin for the shift out signal and a third additional pin for the normal/test select function. It is recognized that these test mode functions are capable of being shared in the functional sense with other pins of a particular integrated circuit, but that is not a critical aspect of the structure.

A preferred method of employment of the above described design-in test feature contemplates selecting the shift-in and shift out points to localize test procedures to particular components, or to further associate sets of components in test mode to form still larger effective shift register structures.

Turning now to FIG. 10a, there is shown an illustration of an aggregate of flip-flops 112 and 114, representative of any elements, at least bistable in character, (including flip flops and like elements) which are connected in a manner (not shown) to form a user logic application. The form, function, purpose and details of the user logic may be that of components of the RS decoder as described above, but the details of the user logic are not a critical limitation for the structure or operation as here described. The requirements of other elements (gates and the like) is similarly irrelevant to the present invention, although probably critical to the user logic. In FIG. 10b, the same flip flops 112 and 114 are shown, each comprising an additional respective "init/-debug" MUX 116 and 118. The respective inputs IN2 and IN4 gain access to the respective flip-flop elements when the MUXs 116 and 118 are placed in the "operate mode by control line X10. That is, the input is derived from whatever gate or other element of the user logic is normally accessible to the flip flop in this mode. The outputs OUT2 and OUT4 of the flip-flop elements are likewise connected to the elements of the user logic circuit as prescribed, but these outputs are each also connected to another flip-flop through the init/debug MUX of such other flip-flop. When the initialize or debug signal is asserted to all MUXs such as 116 or 118, an effective shift register results. When the init/debug signal is removed, the several flip-flop elements are returned to a condition of relative independence subject only to the constraints of the user logic circuit.

Two utilization techniques are apparent. When the init/debug condition is asserted, a sequence of datums may be delivered through the first flip-flop of the effective shift register until the final flip-flop receives the first datum of that sequence. The init/debug condition is then removed. The user logic is initialized to the state prescribed by the train of datums shifted into the effective shift register. In the present invention, one of the initialization parameters is the length of each of the variable length hypersystolic arrays of the decoder (the PST 30, the ST 50 and the CT70). Another initialization condition is the setting of the value of certain constants such as provided for x register 35 of the PST cell 31. In yet another initialization procedure, one may arrange that similar functional modules such as splitter 10, joiner 14, delay module 18 and corrector module 20 contain identical structure and acquire their respective distinctions by an initialization command.

The second manner of usage occurs when operation of the user logic is suspended and the init/debug control is asserted. The content of the effective shift register is then shifted through the last stage of the effective shift register where the string of datums is received for analysis. The nature of the apparatus for receipt may comprise a digital recording means, the input of a computational instrument, display apparatus or like equipment. A diagnostic record is created to indicate the status of of the user logic at the time of assertion of the init/debug signal.

The method and apparatus for carrying out the diagnostic and test arrangements described above are applicable for logic circuits embodied in single integrated circuits as well as circuits implemented with discrete constituents. With all the bistable elements on a single chip configured to produce an effective shift register, the addition of two pins to accommodate the shift-in and shift-out functions allows portions of all integrated circuits in the system to function as an effective shift register encompassing the entire user logic.

A prototype of the invention described herein has been implemented in silicon ECL logic to treat symbols (data width) of 6 bits. This apparatus decodes an RS code of length 63, redundancy 10 for correcting up to 5 symbol errors per block. The prototype exhibits satisfactory performance at information rates of 820 Mbps. The entire decoder is housed on a single printed circuit board. While the invention described herein has been illustrated by means of specific embodiments and applications thereof, a number of modifications and variations could be made thereto by those skilled in the art without departing from the scope and spirit of the present invention. It is therefore to be understood that within the scope of the appended claims, the invention may be practiced otherwise than as specifically described herein.

What is claimed is:

1. A hypersystolic apparatus for operating upon a serialized Reed-Solomon encoded information stream, said stream possibly corrupted by errors and comprising sequential symbol blocks each of length N symbols and redundancy r for correcting as many as T=errata encountered in each said symbol block of said information stream, comprising (a) data stream splitter for producing a copy of said information stream whereby first and second information streams are initially identical for separate processing and said information streams are initially synchronized, each said information stream comprising consecutive blocks of said N symbols, each said symbol comprising m bits, (b) dual channel digital delay line means for propagating each of said first and second information streams along respective channels to error corrector means, said channel supporting said second information stream further comprising a plurality of joiner means for diverting said second information stream onto respective propagation paths comprising first, second and third folded hypersystolic arrays and returning said second information stream from said lateral propagation paths to said respective channel of said digital delay line, whereby said second information stream is processed in each of said hypersystolic arrays to produce a stream of error corrector information, (c) said first hypersystolic array defining a first lateral folded data path for processing said second information stream to evolve same to a stream of r power sum symmetric functions S of each said Reed-Solomon symbol block, (d) said second hypersystolic array defining said second lateral path for receiving said serialized power sum symmetric functions and determining solutions of the key equation therefor, to obtain serialized polynomials $\omega(z)$ and $\sigma(z)$ of minimum degree satisfying $$(1+S(z))\sigma(z) = \omega(z) \bmod z^r$$

where said $\sigma(z)$ comprise coefficients of the error location polynomial, said $\omega(z)$ comprise the error valuator polynomial, said second data stream modified by said second hypersystolic array to comprise T+1 coefficients of said polynomial $\sigma$ and T coefficients of said polynomial $\omega$, (e) said third hypersystolic array being for receiving said polynomial coefficients $\sigma$ and $\omega$ and producing therefrom a serialized stream of correction information for return to said second channel of said dual channel digital delay line, said correction information stream being synchronized with said first information stream, (f) corrector means for linearly combining each datum of said first information stream with the respective datum of said correction stream to produce a corrected data stream.

2. The apparatus of claim 1 wherein synchronization of elements of said apparatus is achieved by supplying clocking information serially to each communicating element of said apparatus, whereby global synchronization of the apparatus is avoided.

3. The apparatus of claim 2, said data stream splitter comprising means for indicating a separation between adjacent symbol blocks of said second information stream.

4. The apparatus of claim 3, said first hypersystolic array comprising validity indicating means for distinguishing r valid datums processed by said first hypersystolic array in N datums supplied thereto from N-r datums not representing said power sum symmetric functions $S_j$.

* * * * *

UNITED STATES PATENT AND TRADEMARK OFFICE
CERTIFICATE OF CORRECTION

PATENT NO. : 4,958,348
DATED : September 18, 1990
INVENTOR(S) : Elwyn R. Berlekamp et al.

It is certified that error appears in the above-identified patent and that said Letters Patent is hereby corrected as shown below:

| | |
|---|---|
| Col. 7, line 62 | Change "(EOPMUP)" to --(EOPM_UP)--; |
| Col. 8, line 11 | Change "(EOPMUP)" to --(EOPM_UP)--; |
| Col. 8, line 16 | Change "LASTEOPMUP" to --LAST_EOPM_UP--; |
| Col. 8, line 18 | Change "EOPMUP" to --EOPM_UP--; |
| Col. 8, line 18 | Change "LASTEOPMUP" to --LAST_EOPM_UP--; |
| Col. 8, line 26 | Change "EOPMUP" to --EOPM_UP--; |
| Col. 8, line 27 | Change "LASTEOPMUP" to --LAST_EOPM_UP--; |
| Col. 8, line 48 | Change "DATA DOWN" to --DATA_DOWN--; |
| Col. 8, line 51 | Change "$\alpha i$" to --$\alpha^i$--; |
| Col. 11, line 2 | Change "STOP and SBOT" to --S_TOP and S_BOT--; |
| Col. 11, line 5 | Change "STOP and SBOT" to --S_TOP and S_BOT--; |
| Col. 11, line 7 | Change "RTOP and RBOT" to --R_TOP and R_BOT--; |
| Col. 11, line 26 | Change "VALIDUP" to --VALID_UP--; |
| Col. 11, line 67 | Change "DATA DOWN" to --DATA_DOWN--; |

UNITED STATES PATENT AND TRADEMARK OFFICE
CERTIFICATE OF CORRECTION

PATENT NO. : 4,958,348

DATED : September 18, 1990

INVENTOR(S) : Elwyn R. Berlekamp et al.

It is certified that error appears in the above-identified patent and that said Letters Patent is hereby corrected as shown below:

| | |
|---|---|
| Col. 12, line 6 | Change ""cp")" to --"cp"--; |
| Col. 12, line 14 | Change "sti" to --st_i--' |
| Col. 12, line 15 | Change "st(i+1)" to --st_(i+1)--; |
| Col. 12, line 29 | Change "EOPMUP" to --EOPM_UP--; |
| Col. 14, line 9 | After "to" insert --be in error.--; |
| Col. 14, lines 51-52 | Change "VALIDUP" to --VALID_UP--; |
| Col. 14, line 59 | After "of" change "o" to --$\sigma$--; |
| Col. 18, line 43 | Change "ps1 and ps2" to --ps_1 and ps_2--; |
| Col. 18, line 55 | Change "ps_1" should read --PS_1--. |
| Col. 18, line 59 | Change "EOPMUP" to --EOPM_UP--; |
| Col. 18, line 60 | Change "PS2" to --PS_2--; |
| Col. 18, line 61 | Change "PS1. In PS2" to --PS_1. In PS_2--; |
| Col. 18, line 67 | Change "PS2" to --PS_2--; |
| Col. 19, line 1 | After "TABLE 9a" insert --TABLE 9b--; |
| Col. 19, lines 14-25 | Delete contents of "TABLE 9b" |

UNITED STATES PATENT AND TRADEMARK OFFICE
CERTIFICATE OF CORRECTION

PATENT NO.   : 4,958,348
DATED        : September 18, 1990
INVENTOR(S)  : Elwyn R. Berlekamp et al.

It is certified that error appears in the above-identified patent and that said Letters Patent is hereby corrected as shown below:

Col. 19, lines 40-41   Change "DATAUP or DATADWN" to
                       --DATA_UP or DATA_DOWN--;

Col. 20, line 39       Change "st1, st2 and st3" to
                       --st_1, st_2 and st_3--;

Col. 20, line 40       Change "STOP" to --S_TOP--;

Col. 20, line 41       Change "S BOT" to --S_BOT--;

Col. 20, line 58       Change "(st1→st2→st3)" to
                       --(st_1→st_2→st_3)--;

Col. 20, line 59       Change "(st3→st2→st1)" to
                       --st_3→st_2→st_1)--;

Col. 20, line 63       Change "SBOT" to --S_BOT--;

Col. 20, line 64       Change "STOP" to --S_TOP--;

Col. 21, line 4        Change "$0 \approx i \approx 6$" to --$0 \leq i \leq 6$--.

Signed and Sealed this

Thirteenth Day of October, 1992

Attest:

DOUGLAS B. COMER

*Attesting Officer*        Acting Commissioner of Patents and Trademarks